(12) United States Patent
Crutchfield

(10) Patent No.: US 12,000,046 B1
(45) Date of Patent: Jun. 4, 2024

(54) LOAD ASSEMBLIES FOR LOADING PARTS IN A FURNACE

(71) Applicant: Rolls-Royce High Temperature Composites, Inc., Cypress, CA (US)

(72) Inventor: Jeffrey Crutchfield, Cypress, CA (US)

(73) Assignee: Rolls-Royce High Temperature Composites, Inc., Cypress, CA (US)

( * ) Notice: Subject to any disclaimer, the term of this patent is extended or adjusted under 35 U.S.C. 154(b) by 0 days.

(21) Appl. No.: 17/646,426

(22) Filed: Dec. 29, 2021

(51) Int. Cl.
*C23C 16/455* (2006.01)
*C23C 16/46* (2006.01)

(52) U.S. Cl.
CPC ........ *C23C 16/45559* (2013.01); *C23C 16/46* (2013.01)

(58) Field of Classification Search
CPC .......................... C23C 16/45559; C23C 16/46
See application file for complete search history.

(56) References Cited

U.S. PATENT DOCUMENTS

| | | | |
|---|---|---|---|
| 2,096,707 A | 10/1937 | Campbeil | |
| 5,362,228 A | 11/1994 | Vaudel | |
| 5,436,042 A | 7/1995 | Lau et al. | |
| 5,453,124 A | 9/1995 | Moslehi et al. | |
| 5,480,678 A * | 1/1996 | Rudolph | C23C 16/045 |
| | | | 118/724 |
| 5,595,606 A | 1/1997 | Fujikawa et al. | |
| 5,746,875 A | 5/1998 | Maydan et al. | |
| 5,853,485 A * | 12/1998 | Rudolph | F16D 65/126 |
| | | | 118/728 |
| 5,904,957 A * | 5/1999 | Christin | C23C 16/455 |
| | | | 427/255.12 |
| 6,450,117 B1 | 9/2002 | Murugesh et al. | |
| 6,502,530 B1 | 1/2003 | Turlot et al. | |
| 6,572,371 B1 * | 6/2003 | Sion | C23C 16/26 |
| | | | 118/724 |
| 6,669,988 B2 | 12/2003 | Daws et al. | |

(Continued)

FOREIGN PATENT DOCUMENTS

| | | |
|---|---|---|
| CN | 105256110 A | 1/2016 |
| CN | 106698919 A | 5/2017 |

(Continued)

OTHER PUBLICATIONS

U.S. Appl. No. 17/564,472, filed Dec. 29, 2021, naming inventor Crutchfield.

(Continued)

*Primary Examiner* — Jeffrie R Lund
(74) *Attorney, Agent, or Firm* — Shumaker & Sieffert, P.A.

(57) ABSTRACT

In various aspects, a preheater, a directed flow chemical vapor infiltration/chemical vapor deposition (CVI/CVD) furnace, and/or an installation jig are described. In one example, a preheater includes a central inlet; a circuitous gas flow path downstream of the central inlet; a plenum section downstream of the circuitous gas flow path; and an outlet diffuser plate defining a plurality of apertures fluidly configured to couple the preheater to a furnace working zone, wherein the outlet diffuser plate is downstream of the plenum section, wherein the circuitous gas flow path is fluidly coupled to the plenum section by an outer circumferential slot opening.

19 Claims, 10 Drawing Sheets

(56) References Cited

U.S. PATENT DOCUMENTS

| | | | | |
|---|---|---|---|---|
| 6,942,893 B2* | 9/2005 | Delperier | ............... | C04B 35/83 427/255.12 |
| 6,953,605 B2* | 10/2005 | Sion | ............... | C04B 35/83 427/248.1 |
| 7,335,397 B2* | 2/2008 | Rudolph | ............... | C23C 16/045 427/255.12 |
| 7,691,440 B2* | 4/2010 | Bernard | ............... | C23C 16/045 427/255.12 |
| 7,691,443 B2* | 4/2010 | Rudolph | ............... | C23C 16/26 427/249.2 |
| 8,163,088 B2* | 4/2012 | Lamouroux | ............... | C23C 16/045 156/345.33 |
| 8,491,963 B2* | 7/2013 | Lamouroux | ............... | C23C 16/45578 427/255.12 |
| 9,498,903 B2 | 11/2016 | Lyons et al. | | |
| 9,540,731 B2 | 1/2017 | Noorbakhsh et al. | | |
| 9,834,842 B2* | 12/2017 | Kirkpatrick | ............... | F16D 65/126 |
| 10,017,424 B2 | 7/2018 | Landwehr | | |
| 10,233,540 B2* | 3/2019 | Bertrand | ............... | C23C 16/458 |
| 10,392,696 B2* | 8/2019 | Bertrand | ............... | C23C 16/045 |
| 10,407,769 B2* | 9/2019 | Rudolph | ............... | C23C 16/52 |
| 10,655,219 B1* | 5/2020 | Finley | ............... | C23C 16/4412 |
| 10,731,252 B2* | 8/2020 | Harris | ............... | C04B 35/62873 |
| 10,752,988 B2* | 8/2020 | She | ............... | C23C 16/26 |
| 11,512,024 B2* | 11/2022 | Lamouroux | ............... | C04B 35/83 |
| 2002/0076491 A1* | 6/2002 | Delperier | ............... | C23C 16/26 427/248.1 |
| 2003/0035893 A1* | 2/2003 | Daws | ............... | C23C 16/26 427/255.12 |
| 2007/0227783 A1* | 10/2007 | Rudolph | ............... | G01G 17/04 177/245 |
| 2007/0275339 A1 | 11/2007 | Cress et al. | | |
| 2008/0099147 A1 | 5/2008 | Myo et al. | | |
| 2008/0152803 A1* | 6/2008 | Lamouroux | ............... | C23C 16/4587 118/724 |
| 2010/0092697 A1* | 4/2010 | Poppe | ............... | C30B 25/165 118/725 |
| 2011/0064891 A1* | 3/2011 | Golecki | ............... | C04B 35/83 427/587 |
| 2012/0153298 A1* | 6/2012 | Kordina | ............... | H01L 21/67109 118/724 |
| 2012/0321779 A1* | 12/2012 | Vargas | ............... | C23C 16/4405 118/724 |
| 2015/0150682 A1* | 6/2015 | Vargas | ............... | A61F 2/3094 427/2.26 |
| 2017/0268101 A1* | 9/2017 | Rudolph | ............... | C23C 16/4583 |
| 2019/0367418 A1 | 12/2019 | Harris | | |
| 2021/0147302 A1 | 5/2021 | Bortoluzzi et al. | | |
| 2021/0155558 A1 | 5/2021 | Bortoluzzi et al. | | |

FOREIGN PATENT DOCUMENTS

| | | |
|---|---|---|
| EP | 1501963 B1 | 2/2005 |
| KR | 100978454 B1 | 8/2010 |
| WO | 96007533 A1 | 3/1996 |
| WO | 96015285 A1 | 5/1996 |

OTHER PUBLICATIONS

U.S. Appl. No. 17/646,419, filed Dec. 29, 2021, naming inventor Crutchfield.

* cited by examiner

LOAD ASSEMBLIES FOR LOADING PARTS IN A FURNACE

TECHNICAL FIELD

The present disclosure relates to load assemblies for holding preforms within high-temperature furnaces during CVI (chemical vapor infiltration) and CVD (chemical vapor deposition) processes.

BACKGROUND

High-temperature parts processing such as melt infiltration, chemical vapor infiltration and chemical vapor deposition are often performed using a furnace. In some cases, rather than loading parts directly into a furnace for processing, parts are loaded into a load assembly before the retort is loaded into a furnace for processing. A load assembly may be called a retort device or may be alternatively called a crucible.

SUMMARY

In one example, the disclosure is directed to a preheater comprising: a central inlet; a circuitous gas flow path downstream of the central inlet; a plenum section downstream of the circuitous gas flow path; and an outlet diffuser plate defining a plurality of apertures fluidly configured to couple the preheater to a furnace working zone, wherein the outlet diffuser plate is downstream of the plenum section, wherein the circuitous gas flow path is fluidly coupled to the plenum section by an outer circumferential slot opening.

In another example, the disclosure is directed to a chemical vapor infiltration/chemical vapor deposition (CVI/CVD) furnace comprising: a preheater comprising: a central inlet; a circuitous gas flow path downstream of the central inlet; a plenum section downstream of the circuitous gas flow path; and an outlet diffuser plate defining a plurality of apertures fluidly configured to couple the preheater to a furnace working zone, wherein the outlet diffuser plate is downstream of the plenum section, wherein the circuitous gas flow path is fluidly coupled to the plenum section by an outer circumferential slot opening.

In another example, the disclosure is directed to method of preheating reactant gases for a chemical vapor infiltration/chemical vapor deposition (CVI/CVD) furnace comprising: receiving reactant gases in a preheater through a central inlet of the preheater; heating the received reactant gases while the gases flow through a circuitous gas flow path of the preheater, wherein the preheater includes a plenum section downstream of the circuitous gas flow path, and wherein the circuitous gas flow path is fluidly coupled to the plenum section by an outer circumferential slot opening; and outputting the heated reactant gases into a working zone of the furnace through an outlet diffuser plate defining a plurality of apertures fluidly coupling the preheater to the working zone, wherein the outlet diffuser plate is downstream of the plenum section.

In another example, the disclosure is directed to a directed flow chemical vapor infiltration/chemical vapor deposition (CVI/CVD) furnace comprising: a furnace body containing a furnace working zone; a load assembly disposed within the furnace working zone. The load assembly comprises: a first diffuser plate; a second diffuser plate oriented substantially parallel to and spaced apart from the first diffuser plate, wherein the first and second diffuser plates are positioned with respect to each other such that there is a space between the first and second diffuser plates; a fixture configured to be positioned in the space and supported between the first and second diffuser plates, wherein the fixture is configured to contain a part to be treated by gases flowing through the load assembly; a plurality of channel forming features configured to be positioned relative to the fixture to guide the flow of gases into a plurality of ducts defined by the plurality of channel forming features and the fixture, wherein the plurality of ducts are configured to at least partially contain gas flowing through the plurality of ducts and direct at least some of the gas to the parts contained by the fixture; wherein each diffuser plate defines a plurality of apertures located at desired areas of the diffuser plate relative to the plurality of ducts such that apertures of the plurality of apertures and ducts of the plurality of ducts are in fluid communication.

In another example, the disclosure is directed to a load assembly comprising: a first diffuser plate; a second diffuser plate oriented substantially parallel to and spaced apart from the first diffuser plate, wherein the first and second diffuser plates are positioned with respect to each other such that there is a space between the first and second diffuser plates; a fixture configured to be positioned in the space and supported between the first and second diffuser plates, wherein the fixture is configured to contain a part to be treated by gases flowing through the load assembly; a plurality of channel forming features configured to be positioned relative to the fixture to guide the flow of gases into a plurality of ducts defined by the plurality of channel forming features and the fixture, wherein the plurality of ducts are configured to at least partially contain gas flowing through the plurality of ducts and direct at least some of the gas to the parts contained by the fixture; wherein each diffuser plate defines a plurality of apertures located at desired areas of the diffuser plate relative to the plurality of ducts such that apertures of the plurality of apertures and ducts of the plurality of ducts are in fluid communication.

In another example, the disclosure is directed to a method of CVI/CVD processing comprising: receiving reactant gases in a load assembly, wherein the load assembly is disposed within a furnace working zone; directing the flow of the reactant gases through the load assembly, wherein the load assembly comprises a first diffuser plate, a second diffuser plate oriented substantially parallel to and spaced apart from the first diffuser plate, wherein the first and second diffuser plates are positioned with respect to each other such that there is a space between the first and second diffuser plates; wherein directing the flow of reactant gases includes guiding reactant gases substantially between the first diffuser plate and the second diffuser plate through a plurality of ducts; wherein the plurality of ducts are defined by a plurality of channel forming features and a fixture, wherein the plurality of ducts are configured to at least partially contain reactant gases flowing through the plurality of ducts and direct at least some of the gas to the parts contained by the fixture; wherein the fixture is configured to be positioned in the space and supported between the first and second diffuser plates, wherein the fixture is configured to contain a part to be treated by gases flowing through the load assembly, wherein the plurality of channel forming features are configured to be positioned relative to the fixture to guide the flow of gases into a plurality of ducts defined by the plurality of channel forming features and the fixture; wherein each diffuser plate defines a plurality of apertures located at desired areas of the diffuser plate relative to the plurality of ducts such that apertures of the plurality of apertures and ducts of the plurality of ducts are in fluid communication; and exhausting the reactant gases from the load assembly.

In another example, the disclosure is directed to an assembly comprising: a load assembly configured to be disposed within a furnace working zone, the load assembly comprising a top and a bottom; an installation jig comprising: a lifting plate; a plurality of rods, each rod having a first end and a second end, wherein at least one rod of the plurality of rods has at least one turn near each end; wherein the turn near each end of at least one rod is on a portion of the rod that extends beyond the top and bottom of the load assembly; and wherein the plurality of rods are disposed within apertures in the load assembly and engage with the lifting plate when the load assembly is lifted, such that the load assembly can be lifted from the top by lifting the lifting plate.

In another example, the disclosure is directed to an installation jig, comprising: a lifting plate; and a plurality of rods, each rod having a first end and a second end, wherein at least one rod of the plurality of rods has at least one turn near each end; wherein the turn near each end of at least one rod is configured to be disposed on a portion of the at least one rod that extends beyond the top and the bottom of a load assembly; and wherein the plurality of rods are configured to be disposed within apertures in the load assembly and engage with the lifting plate when the load assembly is lifted, such that the load assembly can be lifted from the top by lifting the lifting plate.

In another example, the disclosure is directed to a method of loading or unloading a furnace, the method comprising: engaging a lifting plate of an installation jig, wherein the lifting plate is located on top of a load assembly having a main body, wherein the main body has a top and a bottom, wherein the load assembly main body is configured to be disposed within a furnace working zone, wherein engaging the lifting plate enables lifting the load assembly through a plurality of rods, each rod having a first end and a second end, wherein at least one rod of the plurality of rods has at least one turn near each end, wherein the turn near each end of at least one rod is on a portion of the rod that extends beyond the top and bottom of the load assembly; lifting the load assembly by applying upward force on the lifting plate; disengaging the lifting plate; and removing the installation jig.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements.

DETAILED DESCRIPTION

Figure 1:
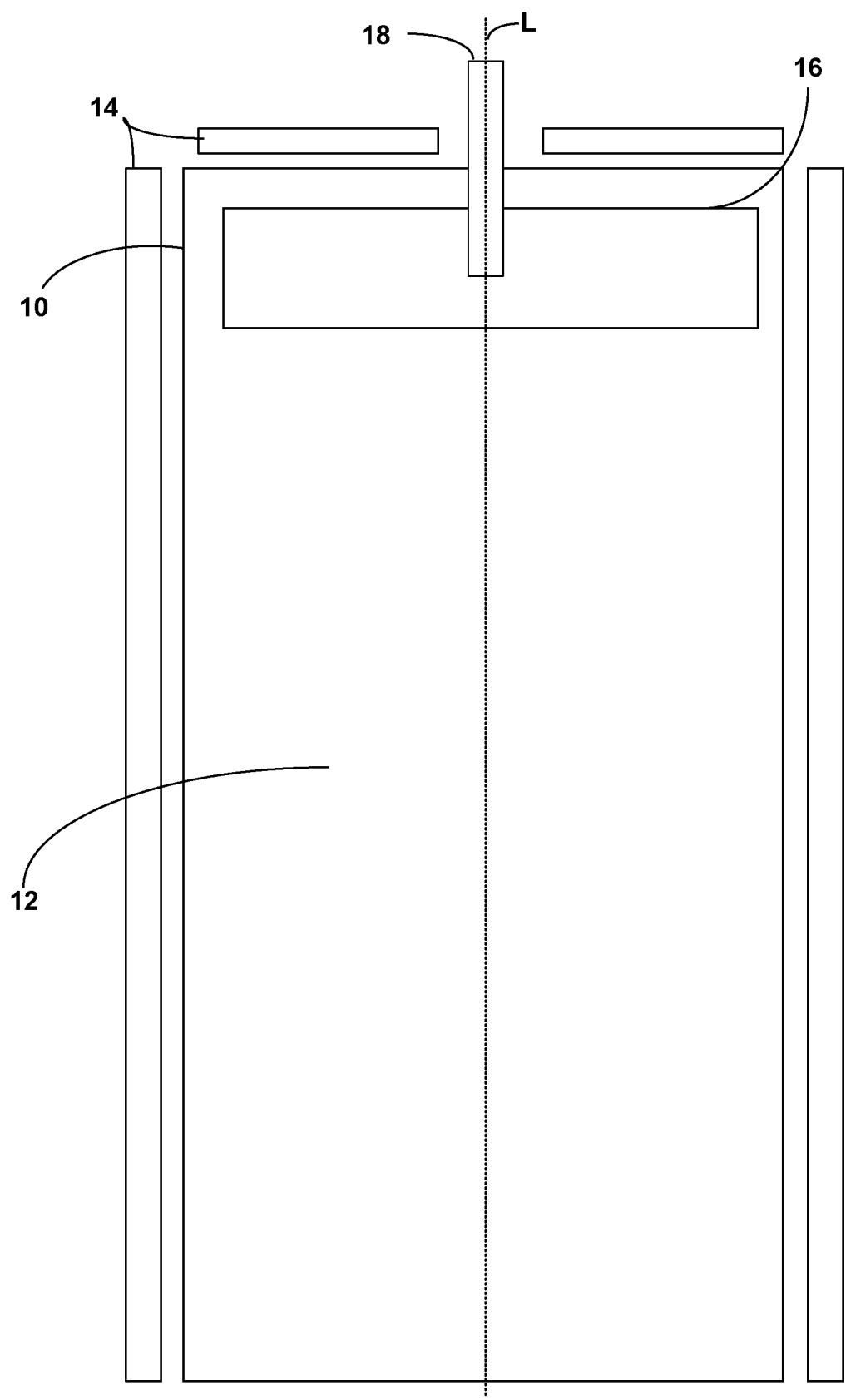
FIG. 1 a schematic side view illustrating an example preheater in an example CVI/CVD furnace.

Load assemblies for chemical vapor infiltration/chemical vapor deposition (CVI/CVD) furnaces may be used to mechanically support parts during CVI, CVD, and/or heat treatment of the parts in a furnace. In some examples, CVI/CVD may be used to deposit material in pores of a porous material, e.g., as part of a technique for manufacturing a ceramic matrix composite.

During CVI/CVD processing, reactant gases are introduced into the load assembly within the furnace. Temperature and concentration of the reactant gases at or adjacent to the parts affect infiltration or deposition of the reactant gases on or in the parts. In some examples, a load assembly may support multiple copies of the same part within the furnace.

As such, it may be desirable to have substantially uniform temperature and reactant concentration near each of the parts so that substantially similar infiltration or deposition occurs at each part.

In some examples, the disclosure describes a CVI/CVD furnace load assembly that includes a preheater and directed flow concept to more uniformly provide reactant gases adjacent to the parts such that the reactant gases more uniformly infiltrate and deposit on parts during CVI/CVD processing. The load assembly of the present disclosure is configured to create substantially uniform boundary conditions (e.g., uniform boundary conditions or nearly uniform boundary conditions) at each part, such that all components result in minimal statistical variation (e.g., all components receive the same or nearly the same treatment) in the deposition rates of reactant gases on parts, increasing uniformity from part-to-part within a batch. Furthermore, a load assembly according to the present disclosure may allow for CVI/CVD processing of a batch of parts without stopping the furnace and moving parts to different sections within the load assembly to account for variation in infiltration an/or deposition rates within the load assembly. This may reduce cost by reducing total time for the CVI/CVD process. Additionally, load assemblies according to the present disclosure may reduce material waste and improve material efficiency by reducing or eliminating channeling, a phenomenon in which reactant gases flow through the load assembly without interacting with any parts.

In some examples, a load assembly for a CVI/CVD furnace may include an installation jig. Conventional installation of a load assembly into a CVI/CVD furnace may be non-ergonomic and unsafe, as the load assembly may be heavy and bulky. An easy-to-use installation jig that does not require additional tools may assist in loading and unloading a load assembly from a CVI/CVD furnace. An installation jig according to the present disclosure may allow the load assembly to be lifted by a lifting plate, while being easily removed from a CVI/CVD furnace load assembly, even when the load assembly is disposed within a furnace. Accordingly, in some examples, a load assembly which includes an installation jig for loading and unloading the load assembly into or out of a furnace may improve the ergonomics, safety, and efficiency of the loading and unloading process.

Some load assemblies include multiple levels, each level configured to mechanically support parts for CVI/CVD processing. Levels of the furnace working zone may be defined by levels of the load assembly, and levels of the load assembly may be defined by a plurality of diffuser plates within the load assembly, including a first diffuser plate and a second diffuser plate. Some CVI/CVD furnaces input reactant gases into a first (e.g., upper) level of a furnace load assembly directly from gas storage. The CVI/CVD furnace typically operates at high temperatures. Accordingly, the reactant gases are heated to the working temperature of the furnace upon entry into the load assembly. Parts for CVI/CVD processing disposed at locations within the load assembly near the inlet of reactant gases may be exposed to relatively cooler gases that have not yet warmed to the furnace working temperature (compared to parts located further from the inlet of the reactant gases). This may result in the reaction rate may be relatively slower on parts need the reactant gas inlet, causing the rates of infiltration and/or deposition to these parts to be relatively slower. Meanwhile, parts disposed relatively far from the inlet may be exposed to reactant gases that have been heated to the furnace working temperature and experience correspondingly higher rates of infiltration and/or deposition. In some examples, a CVI/CVD furnace load assembly according to the present disclosure may include a preheater configured to preheat reactant gases and provide those gases to the load assembly with a substantially uniform temperature (e.g., uniform or nearly uniform) to reduce or substantially eliminate variation in infiltration or deposition differences due to temperature gradients within the load assembly.

Some load assemblies include diffuser plates which mechanically support parts for CVI/CVD processing at different levels of the furnace working zone. Load assemblies including diffuser plates which define a plurality of uniformly spaced apertures may result in inefficient operation of the CVI/CVD furnace because some reactant gases may channel through the load assembly (i.e., flow through the load assembly in channels between the parts, not reacting depositing or infiltrating any parts). In other words, because the plurality of apertures are not positioned in a pattern based on positioning of the parts in the load assembly, reactant gases flowing through some of the apertures may not interact with any parts, instead flowing straight through the load assembly, resulting in material inefficiency of the CVI/CVD furnace.

In some examples, load assemblies according to the present disclosure include diffuser plates configured to direct the flow of reactant gases to parts located within a fixture, increasing the efficiency of the furnace. For instance, a load assembly may include a first diffuser plate and a second diffuser plate, and the diffuser plates may be oriented parallel to and displaced from each other such that there is a space between the diffuser plates. In the space between the first and the second diffuser plate, a fixture may be positioned, with the fixture supported between the first and second diffuser plates. In some examples, the fixture may be configured to support at least one part to be treated by gases flowing through the load assembly.

The diffuser plates may be configured to direct flow of reactant gases by including a plurality of apertures at locations selected based on part positioning within the space between diffuser plates. For example, a first diffuser plate upstream of a part or parts for CVI/CVD processing may include apertures only at locations selected to direct flow toward the part or parts. In this way, the diffuser plates described herein may reduce gas channeling through the load assembly without interacting with any parts.

In some examples, a load assembly may additionally or alternatively include a plurality of channel forming features downstream of the first diffuser plate (e.g., in the space between the first diffuser plate and the second diffuser plate. The plurality of channel forming features may be positioned relative to the fixture such that, together with the fixture, the plurality of channel forming features and the fixture define a plurality of ducts. The plurality of ducts direct at least some of the gas flow to parts within the load assembly. The fixture may define perforations which allow gases to exit the plurality of ducts toward the part within the fixture. The plurality of ducts may guide the reactant gases that do not infiltrate or deposit on a part substantially through a level of the furnace working zone and into the diffuser plate downstream of the plurality of ducts.

In some examples, a load assembly may include a first diffuser plate and a second diffuser plate, and each diffuser plate may define a plurality of apertures located at selected areas of the diffuser plates relative to the plurality of ducts such that apertures of the plurality of apertures and ducts of the plurality of ducts are in fluid communication.

FIG. 1 illustrates an example furnace 10 having a furnace working zone 12. Furnace 10 may be a CVI/CVD furnace. In the illustrated example, furnace 10 is heated by heating elements 14 located outside furnace 10. In other examples, heating elements 14 may be located within an interior furnace 10. Furnace 10 may be substantially gas tight, meaning gases slowly leak between the interior and exterior of furnace 10, depending on the operating pressure of furnace 10. Furnace 10 may be a vacuum furnace, meaning furnace 10 may be outfitted with equipment to evacuate or partially evacuate atmospheric gases from furnace working zone 12 to reduce a pressure within furnace 12 below atmospheric pressure.

Preheater 16 is disposed within furnace working zone 12. Preheater 16 is configured to heat reactant gases before the reactant gases are introduced into furnace working zone 12. In some examples, preheater 16 may heat reactant gases to substantially the same temperature (e.g., the same temperature or nearly the same temperature) as furnace working zone 12 when furnace 10 is in operation. As used herein, a substantially similar temperature may be a temperature close enough to the temperature working zone that variations in the rates of one or more chemical reactions occurring in furnace working zone 12 as a function of position within furnace working zone 12 are reduced or substantially eliminated (e.g., eliminated or nearly eliminated).

In some examples, preheater 16 may be part of a larger load assembly or retort for processing parts disposed within furnace working zone 12. Central inlet 18 may allow reactant gases to enter preheater 16. As illustrated, preheater 16 is located at the top of furnace working zone 12 and the example furnace is designed to receive reactant gases through central inlet 18 located at the top of furnace 10. Reactant gases then move through preheater 16 and into furnace working zone 12. In other examples, central inlet 18 may be located at the bottom or side of furnace 10, and preheater 16 may be located at the downstream end of central inlet 18, e.g., at the bottom or side of furnace 10.

In some examples, furnace 10 and preheater 16 are at least partially formed of a refractory material, such as graphite. For instance, furnace 10 and preheater 16 may be at least partially formed of a material that is substantially non-reactive to the reactant gases used in the CVD/CVI process performed within furnace 10.

Furnace 10 may be sized to accommodate a batch of parts for CVD/CVI processing, heat treatment, or the like. Accordingly, preheater 16 may be sized to preheat sufficient reactant gases to a temperature substantially the same as the temperature of furnace working zone 12 to support performing CVD/CVI simultaneously on the batch of parts.

In some examples, preheater 16 may have a shape that is influenced by the shape of furnace 10. For instance, if furnace 10 has a cylindrical shape with a substantially circular cross-section, preheater 16 may have a substantially cylindrical shape with a circular cross-section. In other implementations, furnace 10 may have another cross-sectional shape, preheater 16 may have a different cross-sectional shape, and the cross-sectional shapes of furnace 10 and preheater 16 may or may not be the same.

Central inlet 18 may be disposed along a central axis L of preheater 16. Reactant gases flow into preheater 16 through central inlet 18. At least a portion of the interior volume of preheater 16 may define a tortuous gas flow path, which may increase a residence time of the reactant gases within preheater 16 compared to a preheater that includes a non-tortuous flow path. This may increase volumetric efficiency of preheater 16.

Figure 2:
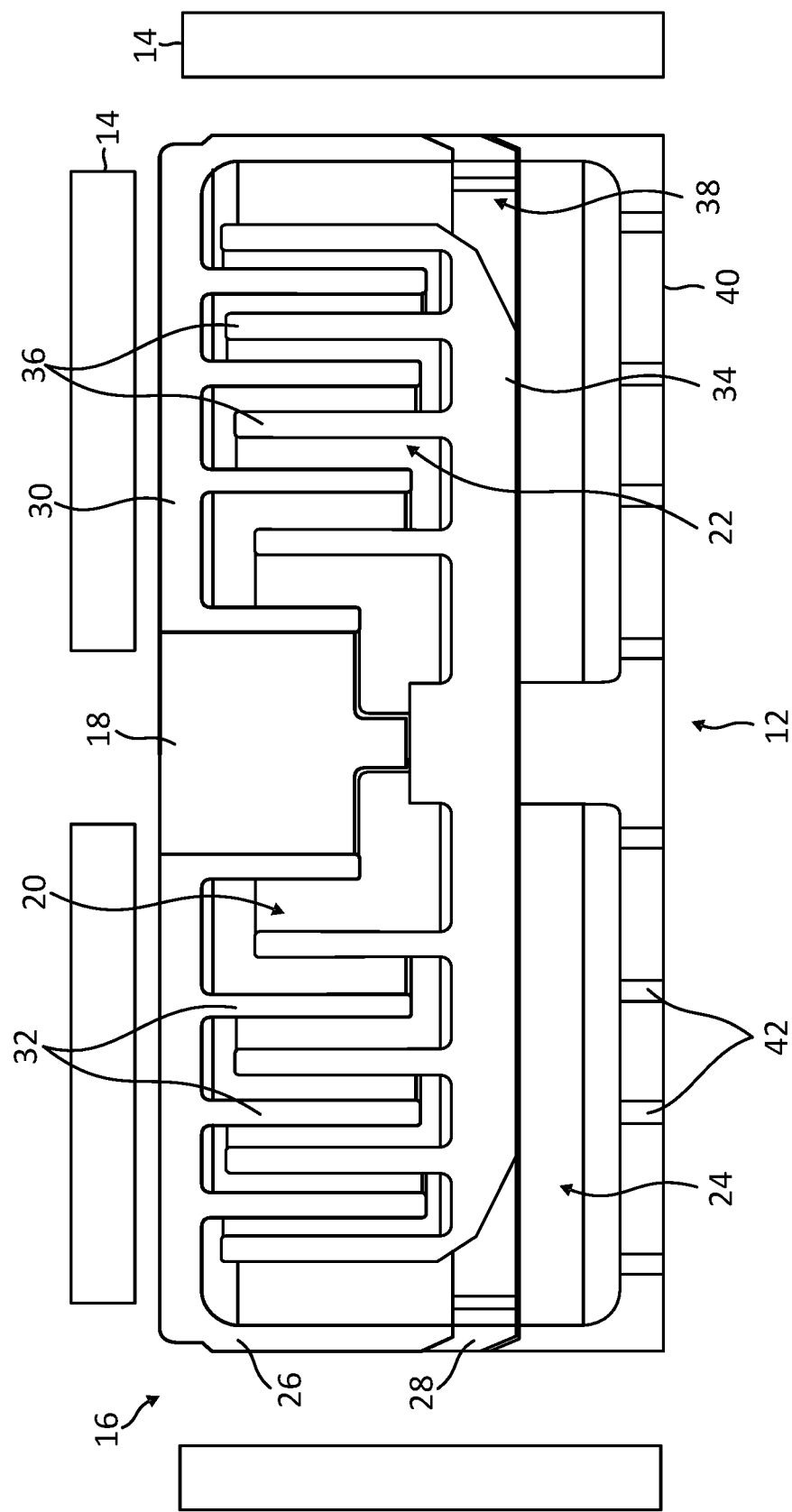
FIG. 2 is a schematic cross-sectional view illustrating an example preheater according to the present disclosure.
Figure 3A:
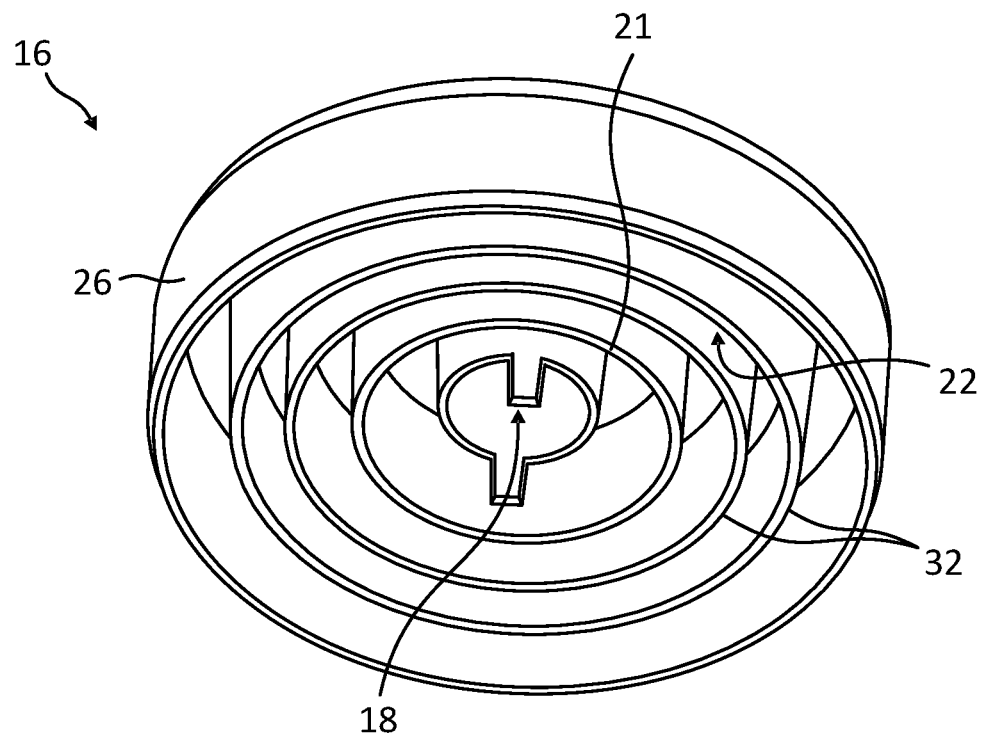
FIG. 3A is a schematic perspective view illustrating a first opposing member of the example preheater of FIG. 2.
Figure 3B:
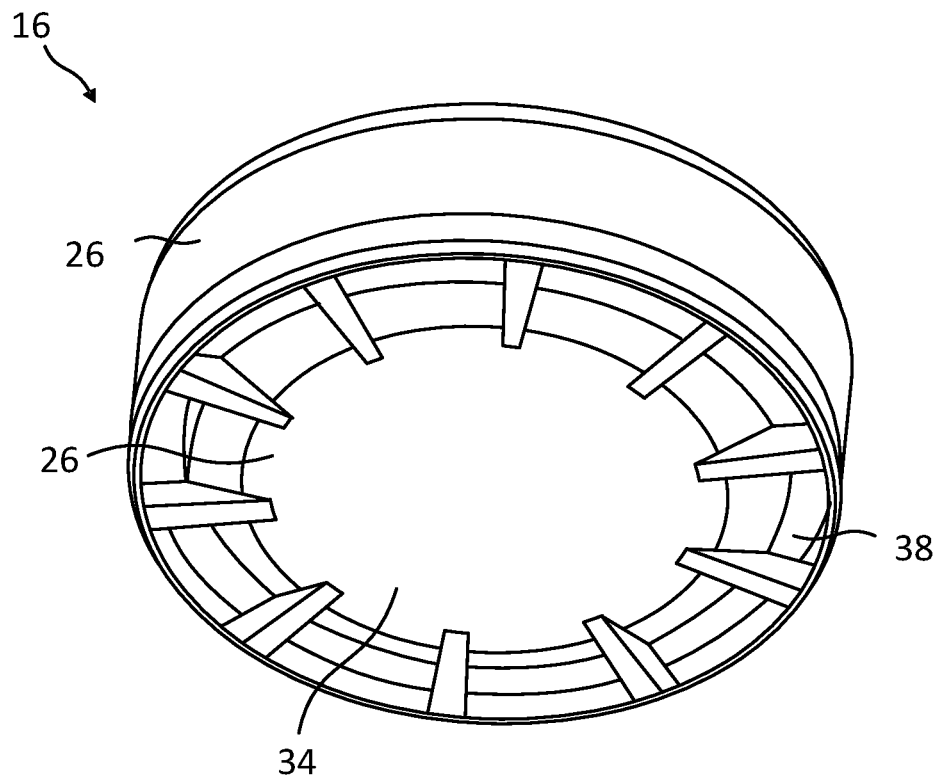
FIG. 3B is a schematic perspective view illustrating two opposing members of the example preheater of FIG. 2.
Figure 4:
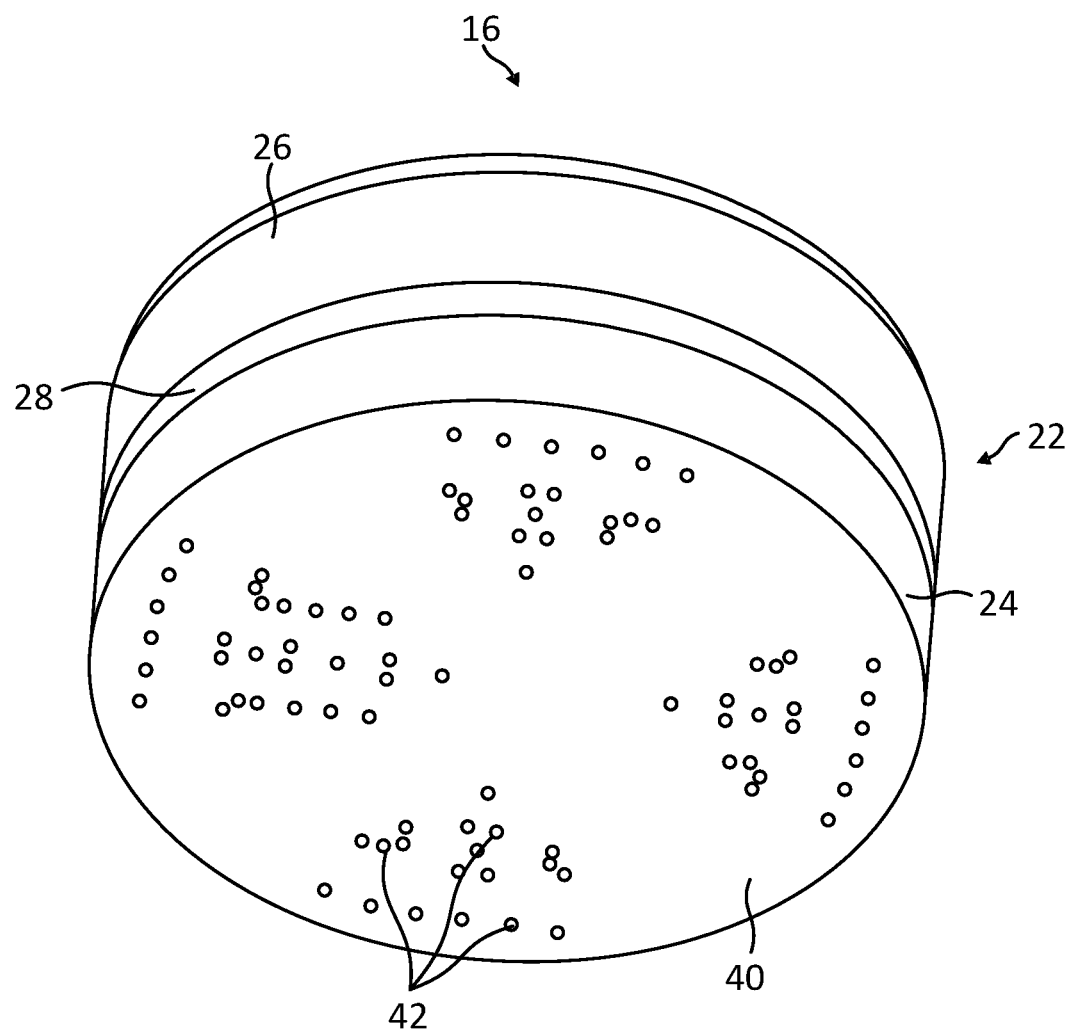
FIG. 4 is a schematic perspective view illustrating the example preheater of FIG. 2.

FIGS. 2-4 illustrate various views of an example preheater 16. FIG. 2 is a cross-sectional view of preheater 16 of FIG. 1, taken along a vertical plane through axis L shown in FIG. 1. FIGS. 3A and 3B illustrate example preheater 16 illustrated in FIG. 2 in perspective view. FIG. 3A illustrates only first opposing member 26, and FIG. 3B illustrates both first opposing member 26 and second opposing member 28. FIG. 4 is a bottom perspective view of preheater 16, including plenum section 24.

Preheater 16 includes central inlet 18. Central inlet 18 may receive reactant gases into preheater 16. Central inlet may include, for example, a cylindrical bore or the like. As shown in FIG. 1, reactant gases flow into central inlet 18 and exit slots 20 near a bottom of central inlet 18 to enter circuitous gas flow path 22. In other examples, slots 20 may be at a different position of central inlet 18, e.g., more toward a center or top of central inlet 18.

Circuitous gas flow path 22 is downstream of central inlet 18 and upstream of plenum section 24, such that reactant gases flow from central inlet 18, through circuitous gas flow path 22, and into plenum section 24. Circuitous gas flow path 22 defines a generally radially outward gas flow path through which gas flows. Reactant gases are heated as they travel through circuitous gas flow path 22 from central inlet 18 to plenum section 24.

Circuitous gas flow path 22 is defined between a first opposing member 26 and a second opposing member 28. First opposing member 26 defines a first internal surface of circuitous gas flow path 22, e.g., a top surface of circuitous gas flow path 22 shown in FIG. 2. First opposing member 26 includes a first member main body 30. First main member body 30 defines a substantially planar portion of first opposing member 26. First member main body 30 may define an outer perimeter corresponding to a perimeter shape of preheater 16, e.g., a circle/cylinder in FIGS. 2-4. In other examples, first member main body 30 may define another suitable outer perimeter, e.g., depending on a perimeter shape of preheater 16.

First opposing member 26 also includes a first plurality of baffles 32. First plurality of baffles 32 extend from first member main body 30 toward second opposing member 28. First opposing member 26 may include any number of baffles 32. In some implementations, first plurality of baffles 32 include a plurality of concentric baffles with a shape corresponding to a perimeter of first opposing member 26. For instance, in the example of FIGS. 2-4, first plurality of baffles 32 may include a plurality of concentric cylindrical baffles. In other implementations, first plurality of baffles 32 may include a different shape, e.g., a shape that does not correspond to a perimeter of first opposing member 26, or may include a continuous wall, such as a continuous spiral wall.

First plurality of baffles 32 extend toward second opposing member 28 but do not contact second opposing member 28. This results in a flow space around the end of each of baffles 32, allowing reactant gases to flow radially outward in all radial directions through circuitous gas flow path 22. The dimensions of the spaces between an end of each of first plurality of baffles 32 and second opposing member 28 may be selected based on, e.g., a flow rate of reactant gases through circuitous gas flow path 22, a desired pressure drop across circuitous gas flow path 22, or the like. In some examples, each space may have the same dimensions. In other examples, at least one space may have different dimensions that at least one other space. Said another way, each baffle of first plurality of baffles 32 may protrude a selected distance from first member main body 30. In some examples, each baffle of first plurality of baffles 32 may protrude the same distance from first member main body 30. In other words, each baffle of first plurality of baffles 32 may have substantially the same height. In some examples, the height of each baffle of plurality of baffles 32 may differ. In some examples, such as the example illustrated in FIG. 2, the baffles may get taller (protrude further) as the distance from central inlet 18 increases, such that circuitous gas flow path 22 gets more tortuous as the radial distance from central inlet 18 increases. This is because the reactant gases must travel further in a direction perpendicular to the radial direction to flow past a baffle.

Second opposing member 28 defines a second internal surface of circuitous gas flow path 22, e.g., a bottom surface of circuitous gas flow path 22 shown in FIG. 2. Second opposing member 28 includes a second member main body 34. Second main member body 34 defines a substantially planar portion of second opposing member 28. In some implementations, second member main body 34 may be substantially parallel to first member main body 30. Second main member body 34 may define an outer perimeter corresponding to a perimeter shape of preheater 16, e.g., a circle/cylinder in FIGS. 2-4. In other examples, second main member body 34 may define another suitable outer perimeter, e.g., depending on a perimeter shape of preheater 16.

The outer perimeter shape and/or size of second opposing member 28 may be substantially the same as the outer perimeter shape and/or size of first opposing member 26. As shown in FIG. 2, for example, this may allow first opposing member 26 and second opposing member 28 to couple to each other. For instance, first opposing member 26 and second opposing member 28 may include mating features to help align first opposing member 26 and second opposing member 28.

Second opposing member 28 also includes a second plurality of baffles 36. Second plurality of baffles 36 extend from second main member body 34 toward first opposing member 26. Second opposing member 28 may include any number of baffles 36. In some implementations, second plurality of baffles 36 include a plurality of concentric baffles with a shape corresponding to a perimeter of second opposing member 28. For instance, in the example of FIGS. 2-4, second plurality of baffles 36 may include a plurality of concentric cylindrical baffles. In other implementations, second plurality of baffles 36 may include a different shape, e.g., a shape that does not correspond to a perimeter of second opposing member 28, or may include a continuous wall, such as a continuous spiral wall. In some examples, the shapes of first plurality of baffles 32 and second plurality of baffles 36 may be substantially similar, aside from differences in size.

Second plurality of baffles 36 extend toward first opposing member 26 but do not contact first opposing member 26. This results in a flow space around the end of each of baffles 36, allowing reactant gases to flow radially outward in all radial directions through circuitous gas flow path 22. The dimensions of the spaces between an end of each of second plurality of baffles 36 and first opposing member 26 may be selected based on, e.g., a flow rate of reactant gases through circuitous gas flow path 22, a desired pressure drop across circuitous gas flow path 22, or the like. In some examples, each space may have the same dimensions. In other examples, at least one space may have different dimensions that at least one other space. Said another way, each baffle of second plurality of baffles 36 may protrude a selected distance from second member main body 34. In some examples, each baffle of second plurality of baffles 36 may protrude the same distance from second member main body 34. In other words, each baffle of second plurality of baffles 36 may have substantially the same height. In some examples, the height of each baffle of second plurality of baffles 36 may differ. In some examples, such as the example illustrated in FIG. 2, the baffles may get taller (protrude further) as the distance from central inlet 18 increases, such that circuitous gas flow path 22 gets more tortious as the radial distance from central inlet 18 increases. This is because the reactant gases must travel further in a direction perpendicular to the radial direction to flow past a baffle.

First plurality of baffles 32 and second plurality of baffles 36 interleave to define circuitous gas flow path 22. First plurality of baffles 32 and second plurality of baffles 36 cooperate to increase the distance that reactant gases travel along circuitous flow path 22, thereby increasing the dwell time of reactant gases in circuitous gas flow path 22. Increased dwell time in circuitous gas flow path 22 may provide for increased heat transfer to incoming reactant gases, and greater heating in a given volume of space.

Second opposing member 28 also defines an outer circumferential slot opening 38. Outer circumferential slot opening 38 may fluidically couple circuitous gas flow path 22 and plenum section 24. Outer circumferential slot opening 38 may extend substantially fully around the perimeter of second member main body 28. As shown in FIG. 3, outer circumferential slot opening 38 may be spanned by a plurality of struts that join and outer perimeter wall of second opposing member 28 and second member main body 34. Second opposing member 28 may include any number of struts. By including outer circumferential slot opening 38, reactant gases may flow radially outward from central inlet 18 to outer circumferential slot opening 38 in all radial directions. This may increase circumferential homogeneity of gas flowing from circuitous gas flow path 22 to plenum section 24.

The downstream side of plenum section 24 may be defined by outlet diffuser plate 40 which fluidically couples preheater 16 to furnace working zone 12 (FIG. 1). Outlet diffuser plate 40 may define a plurality of apertures 42 to allow reactant gases to flow from preheater 16 to furnace working zone 12. In some examples, plurality of apertures 42 may be substantially evenly distributed across outlet diffuser plate 40. In some examples, plurality of apertures 42 may be specifically located in a way configured to direct reactant gases to components within a load assembly downstream of preheater 16. In other words, plurality of apertures 42 may be directly upstream of a location in the furnace working zone 12 configured to support a contain a component for CVI/CVD processing. Plurality of apertures 42 may have any geometric shape or combination of geometric shapes, including circles, slots, or the like.

The portion of furnace working zone 12 which receives reactant gases from preheater 16 may be configured to mechanically support parts for heat treatment, such as CVI processing, CVD processing, or CVI/CVD processing.

Plenum section 24 may be a section of preheater 16 where pressure equalizes across outlet diffuser plate 40, so that flow of reactant gases through plurality of apertures 42 is substantially uniform (e.g., uniform or nearly uniform in flow rate, pressure, temperature, and/or the like). Plenum section 24 may assist in uniform infiltration or deposition of reactant gases on parts during CVI/CVD processing by providing for a uniform static pressure above plurality of apertures 42. The volume of plenum section 24 above outlet diffuser plate 40 may be sufficiently large to reduce the velocity of reactant gases flowing out of circumferential slot outlet 38. The static pressure across each aperture in plurality of apertures 42 may therefore be substantially uniform, which may result in substantially uniform mass flow of reactant gases through each aperture in the plurality of apertures 42 defined by outlet diffuser plate 40. Plenum section 24 thus may be used to achieve controlled mass flow distribution through a CVI or CVD furnace, such as example furnace 10 illustrated in FIG. 1.

Preheater 16 may use energy from furnace working zone 12 and/or plurality of heating elements 14 to heat reactant gases flowing through preheater 16. In some examples, reactant gases enter preheater 16 through central inlet 18 directly from raw material storage at or near room temperature and exit plurality of apertures 110 in outlet diffuser plate 108 at a temperature equal to or substantially the same as the operating temperature of furnace working zone 12. In some examples, the operating temperature of furnace working zone 12 is greater than 800° C. In some examples, the operating temperature of furnace working zone 12 is greater than 1,000° C.

Preheater 16 (and any or all components thereof) may be formed of any suitable material, such as a refractory material. For instance, preheater 16 (and any or all components thereof) may be formed from graphite.

Figure 5:
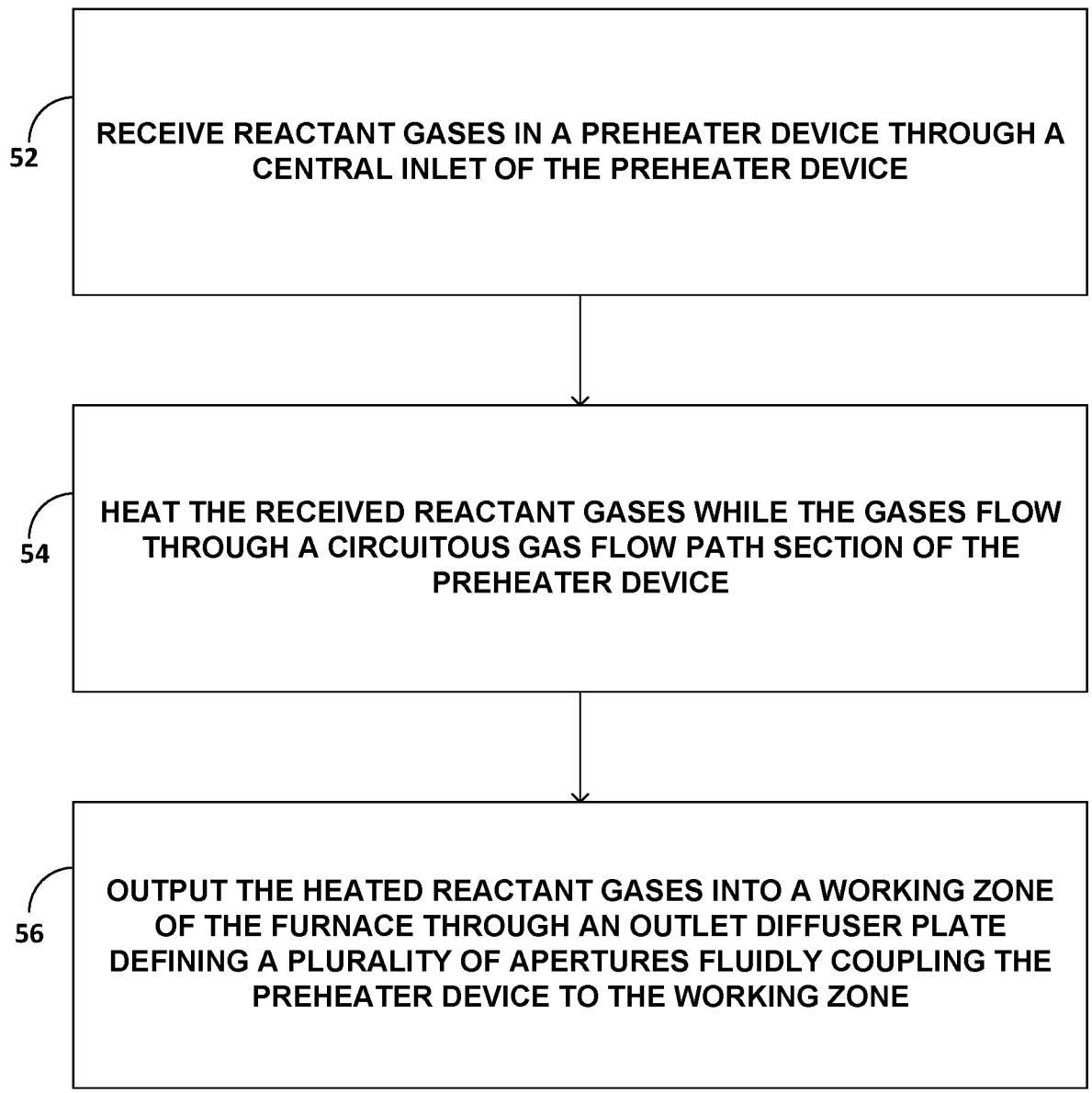
FIG. 5 is a flowchart illustrating an example technique for preheating reactant gases using the example preheater of FIG. 2.

FIG. 5 is a flow diagram illustrating an example technique for preheating reactant gases for a CVI/CVD furnace. The technique of FIG. 5 will be illustrated with reference to FIGS. 1-4. The technique of FIG. 5 includes receiving reactant gases in a preheater 16 through a central inlet of preheater 16 (52).

The technique also includes heating the received reactant gases while the gases flow through circuitous gas flow path 22 of preheater 16 (54). In some examples, heating the reactant gases may include heating the reactant gases to a temperature the same as or substantially the same as a temperature of furnace working zone 12. In some examples, heating the received reactant gases may occur in circuitous gas flow path 22 of preheater 16.

The technique of FIG. 5 further includes outputting the heated reactant gases into a working zone 12 of furnace 10 through an outlet diffuser plate 40 defining a plurality of apertures 42 fluidly coupling preheater 16 to furnace working zone 12 (56). In some examples, plurality of apertures 42 may be positioned at selected locations of outlet diffuser plate 40 to direct flow of the heated reactant gases to particular locations within furnace working zone 12, e.g., corresponding to locations of parts to be processed and/or a load assembly holding parts to be processed within furnace working zone 12.

Figure 6:
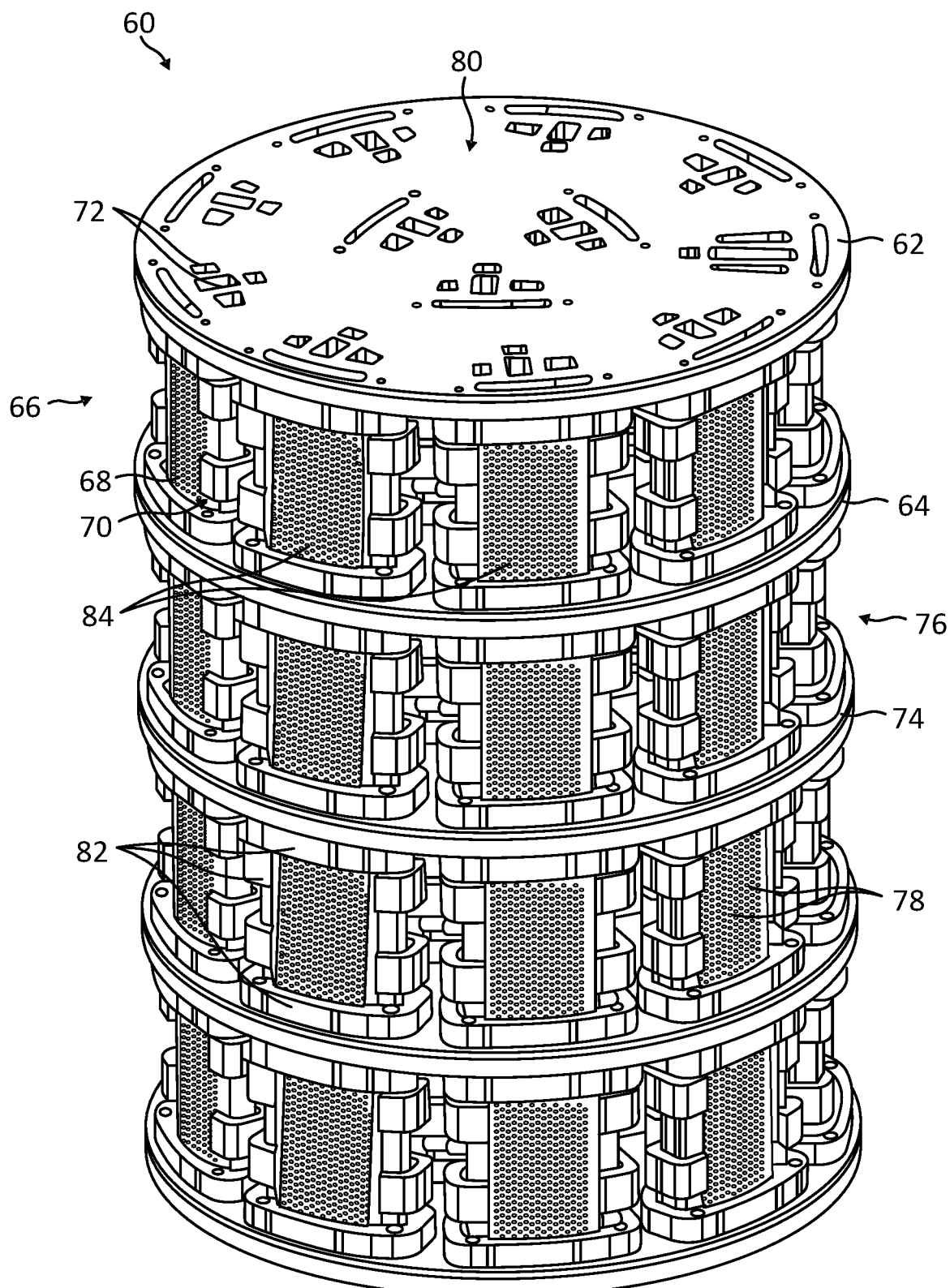
FIG. 6 is a schematic perspective view illustrating an example load assembly for a CVI/CVD furnace according to the present disclosure.
Figure 7:
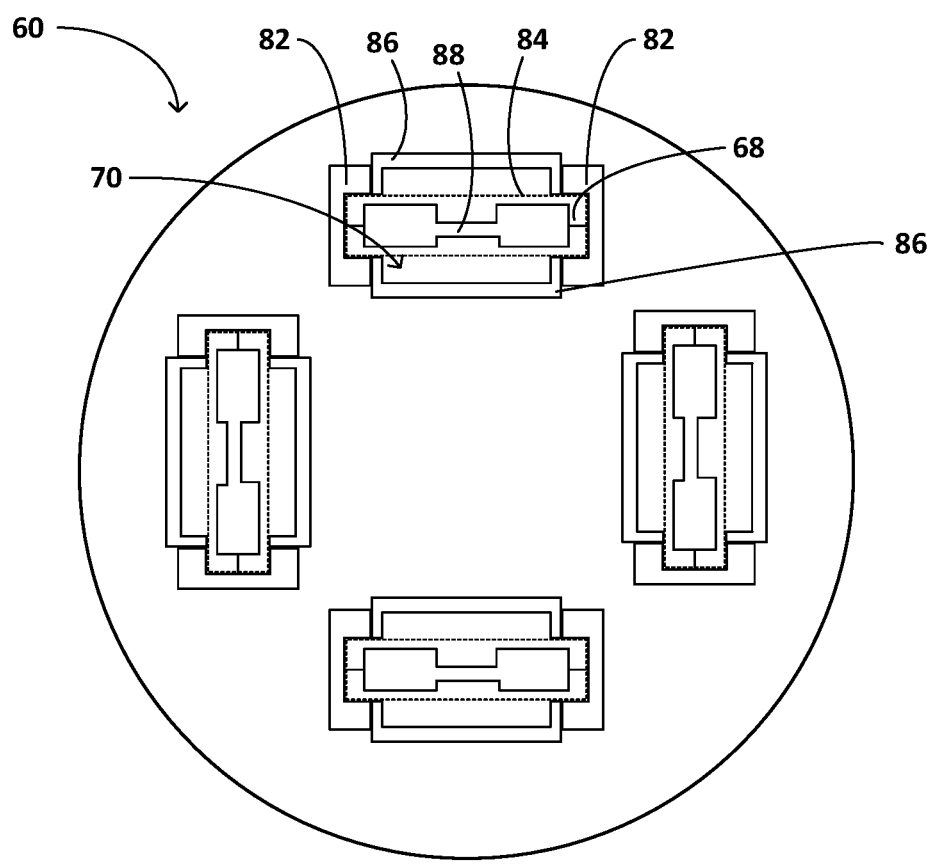
FIG. 7 is a conceptual schematic top view illustrating an example directed flow load assembly for a CVI/CVD furnace.

In some examples, a load assembly may be used alone or in combination with preheater 16 to help direct reactant gases to parts to be processed. The load assembly may be configured to support parts within working zone 12 of furnace 10 and guide flow of reactant gases to the parts to reduce an amount of reactant gas that flows pas the parts without interacting with the parts. In some implementations, in combination with preheater 16, this may help form substantially similar reaction conditions at each part, which may help increase uniformity of parts subject to CVD/CVI in furnace 10. For example, FIG. 6 illustrates a perspective view of an example load assembly 60 according to the present disclosure. FIG. 7 is a top plan view of an example stage of load assembly 60. FIG. 6 illustrates an example of a directed flow load assembly for a CVI/CVD furnace.

Load assembly 60 may be configured to be positioned in a furnace working zone of a furnace during CVI/CVD processing, heat treatment, or the like, such as furnace working zone 12 of CVI/CVD furnace 10 (FIG. 1). Load assembly 60 includes a plurality of diffuser plates, including, for purposes of illustration, first diffuser plate 62, second diffuser plate 64, and third diffuser plate 74. Each of diffuser plates 62, 64, and 76 are oriented substantially parallel to each other. Diffuser plates 62, 64, and 74 are configured to support parts 88 within furnace working zone 12 during processing and to allow reactant gases to flow through working zone 12.

Each adjacent pair of diffuser plates is spaced with respect to each other. For instance, first diffuser plate 62 and second diffuser plate 64 are spaced apart with respect to each other and define a space 66 between facing surfaces of first diffuser plate 62 and second diffuser plate 64. Similarly, second diffuser plate 64 and third diffuser plate 74 are spaced apart with respect to each other and define a space 76 between facing surfaces of second diffuser plate 64 and third diffuser plate 74. Load assembly 60 may include any suitable number of diffuser plates, such as at least two diffuser plates, at least three diffuser plates, at least four diffuser plates, etc. Similarly, load assembly 60 may include any suitable number of levels (e.g., spaces 66, 76). In some implementations, the number of levels (e.g., spaces) may be one less than the number of diffuser plates.

In some examples, first diffuser plate 62 may be outlet diffuser plate 40 in FIG. 4. In other examples, first diffuser plate 62 is configured to be positioned adjacent to outlet diffuser plate 40 of FIG. 4 (in examples in which load assembly 60 and preheater 16 are used together). Second diffuser plate 64 is downstream of first diffuser plate 62, and third diffuser plate 74 is downstream of second diffuser plate 64, such that reactant gases flow through first diffuser plate 62, through space 66, through second diffuser plate 64, through pace 76, through third diffuser plate 74, and the like.

Load assembly 60 also includes a plurality of fixtures 68 configured to be positioned within spaces 66 and 76. Each fixture of plurality of fixtures 68 may be configured to contain a part or parts 88 to be treated by reactive gases flowing through load assembly 60. Each fixture of plurality of fixtures 68 may restrain the part or parts 88 relative to load assembly 60.

Each fixture of plurality of fixtures 68 may have a shape and size selected based on a shape and size of the part or parts 88 which the corresponding fixture is configured to at least partially surround. Depending on the part or parts 88 to be restrained by each fixture of plurality of fixtures 68, the fixtures 68 may be the same or may be different. For instance, plurality of fixtures 68 may include a three-dimensional polygon shape, a shape with complex curvature in one or more axis, combinations thereof, or the like.

Each fixture of plurality of fixtures 68 may include multiple sections, which are configured to be clamped by at least one clamp 82. At least one clamp 82 is configured to retain the multiple sections of the fixture with respect to each other, and to retain the multiple sections of the fixture surrounding part or parts 88. At least one clamp 82 may have any suitable geometry and function that allows at least one clamp 82 to clamp a fixture. In some implementations, as shown in FIG. 7, each fixture may be retained by multiple clamps 82, such as two clamps. In other implementations, as shown in FIG. 6, clamp 82 may include a more complicated geometry and engagement to the fixture. Alternatively, each fixture may be retained by a plurality of clamps 82.

In some examples, at least one clamp 82 and/or the fixture of plurality of fixtures 68 is configured to interface with one or both adjacent diffuser plate(s) to maintain a position of the fixture of plurality of fixtures 68 with respect to the one or both adjacent diffuser plate(s). This may also help maintain the position of adjacent diffuser plate(s) relative to each other.

Load assembly 60 may include one or more features configured to help guide gas flow toward the part or parts 88 held by each fixture of plurality of fixtures 68. For example, diffuser plates 62, 64, 74 may include a plurality of apertures 72 at selected locations of diffuser plates 62, 64, 74. The selected locations may correspond (in the major plane of diffuser plates 62, 64, 74) to locations of plurality of fixtures 68 (and thus, part or parts 88). Diffuser plates 62, 64, 74 may omit apertures 72 at selected locations. For example, diffuser plates 62, 64, 74 may omit apertures at locations (in the major plane of diffuser plates 62, 64, 74) between locations of plurality of fixtures 68 (and thus, part or parts 88). Each aperture of plurality of apertures 72 may have any selected shape, such as circles, ellipses, polygonal (e.g., rectangle, square, etc.), or more complex shapes, such as rounded rectangles, or the like. As such, plurality of apertures 72 may help guide gas flow to within or around plurality of fixtures 68 and, ultimately, to part or parts 88.

As another example, each fixture of plurality of fixtures 68 may include a plurality of perforations 84 configured to allow gas to flow from outside of each fixture to inside of each fixture. Perforations 84 may be positioned uniformly throughout fixtures 68, or may be positioned at selected locations of fixtures 68 to guide reactant gases to part or parts 88 positioned within fixtures 68. Perforations 84 may have any suitable shape, such as circular, elliptical, oval, polygonal, or the like.

Load assembly 60 may include a plurality of channel forming features 86 (FIG. 7) configured to be positioned relative to fixtures 68 to guide the flow of gases into plurality of ducts 70 (FIG. 7) defined by plurality of channel forming features 86 and fixtures 68. Plurality of channel forming features 86 may be substantially non-porous, such that gas cannot pass through the plurality of channel forming features 86. This may help guide gases through perforations 84 to parts 88 (FIG. 7). Plurality of channel forming features 86 may have any suitable shape and size configured to guide gas flow adjacent to and through perforations 84. In this way, plurality of ducts 70 may be configured to at least partially contain gas flowing through plurality of ducts 70 and direct at least some of the gas to parts 88 contained by fixtures 68.

The plurality of apertures 72 in diffuser plates 62, 64, 74 may be located at desired areas of the corresponding diffuser plate relative to plurality of ducts 70 such that apertures of plurality of apertures 72 and ducts of plurality of ducts 70 are in fluid communication, meaning that reactant gases flow through apertures of plurality of apertures 72 into plurality of ducts 70. By doing so, apertures 72 and ducts 70 are configured to reduce or substantially prevent reactant gases from flowing through load assembly 60 without interacting with parts 88.

Load assembly 60 may be formed from any suitable material or combination of materials. For instance, load assembly 60 may be formed from a refractory material, such as a refractory element or ceramic. In some examples, load assembly 60 may be formed from graphite. Graphite may be a desirable material of construction for one or more of furnace 10, first diffuser plate 62, second diffuser plate 64, fixture 68, or plurality of channel forming features (not shown) due to the thermal conductivity and thermal stability of graphite.

Figure 8:
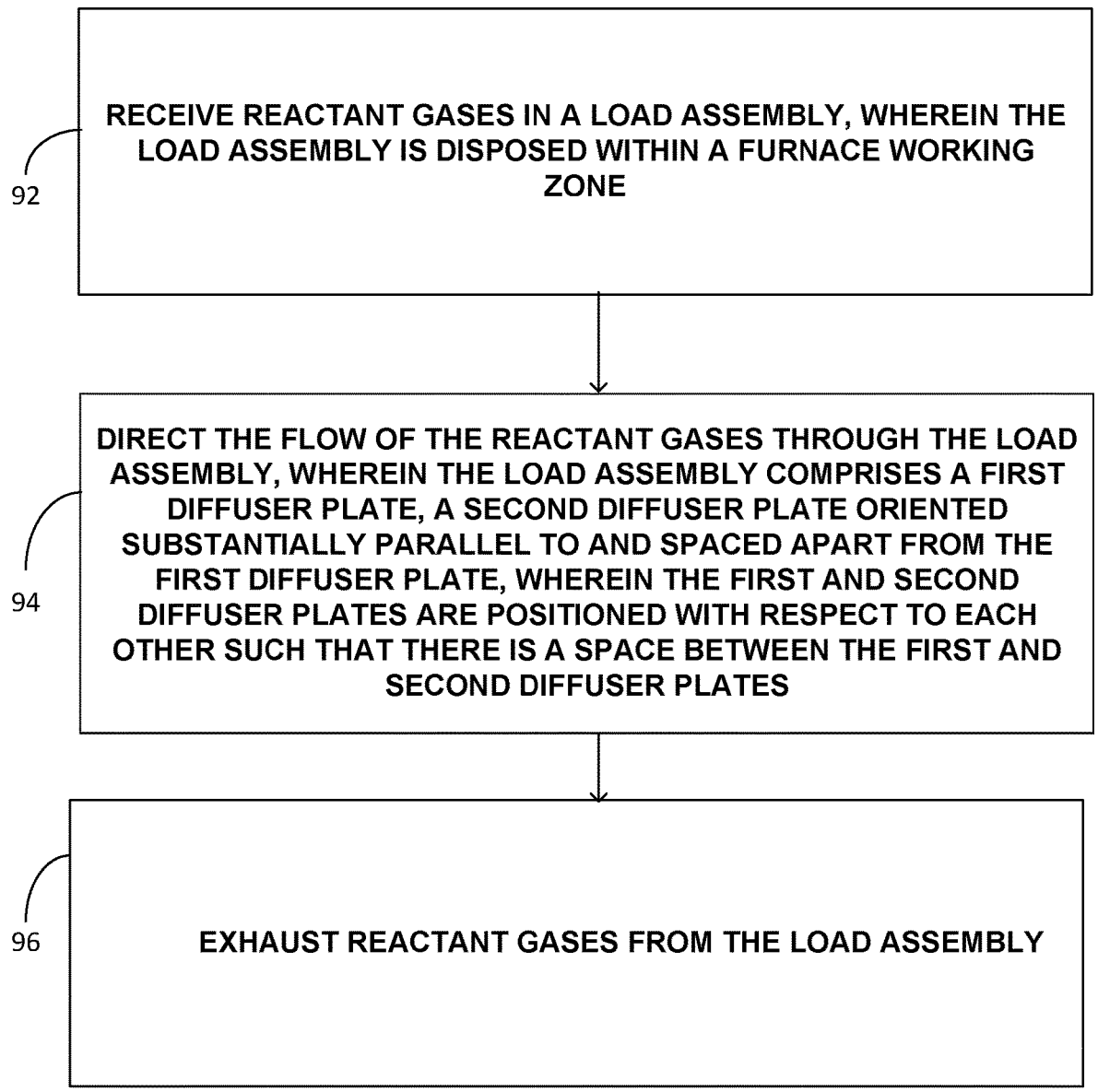
FIG. 8 is a flowchart illustrating an example technique for directing the flow of reactant gases in a CVI/CVD furnace using a directed flow load assembly.

FIG. 8 is a flowchart illustrating a technique for CVI/CVD processing of parts 88 using load assembly 60 according to the present disclosure. The technique of FIG. 8 will be described with concurrent reference to FIGS. 6 and 7. A person having skill in the art will understand that the technique of FIG. 8 may be performed using a different load assembly, and that load assembly 60 may be used to perform different techniques. The technique of FIG. 8 includes receiving reactant gases in load assembly 60, where load assembly 60 is disposed within a furnace working zone 12 (FIG. 1; 92).

The example technique of FIG. 8 also includes directing the flow of the reactant gases through load assembly 60, where load assembly 60 comprises a first diffuser plate 62, a second diffuser plate 64 oriented substantially parallel to and spaced apart from first diffuser plate 62, wherein the first and second diffuser plates 62, 64 are positioned with respect to each other such that there is a space 66 between the first and second diffuser plates 62, 64 (94).

In some examples, directing the flow of reactant gases through load assembly 60 may include directing the flow of reactant gases through load assembly 60 at a relatively high velocity. Directing reactant gases through load assembly 60 at a relatively high velocity may assist in uniform infiltration or deposition of parts 88 located at different levels of load assembly 60 if load assembly 60 is a multilevel load assembly. A high velocity may be defined as a velocity at which the concentration of reactant gases is the same or nearly the same at each level of load assembly 60. Since reactant gases react with parts 88 disposed within load assembly 60, the concentration of reactant gases may change across levels of load assembly 60. For example, reactant gases may enter a first level of a load assembly 60 at a first concentration and exit a last level of load assembly 60 at a second concentration, where the second concentration is lower than the first concentration. Directing reactant gases at a relatively high velocity through load assembly 60 may combat this phenomenon by reducing the dwell time of reactant gases at each level in load assembly 60, increasing an effective concentration of the reactant gases at each level. In some examples, a relatively high velocity of the gases through load assembly 60 is at least about 20 meters per second (m/s) such as greater than 20 m/s.

The example technique of FIG. 8 also includes exhausting reactant gases from the load assembly (96). In some examples, exhausting reactant gases may include flowing reactant gases through third diffuser plate 74 illustrated in FIG. 6. In some examples, unreacted reactant gases may be recirculated through load assembly 60.

Figure 9:
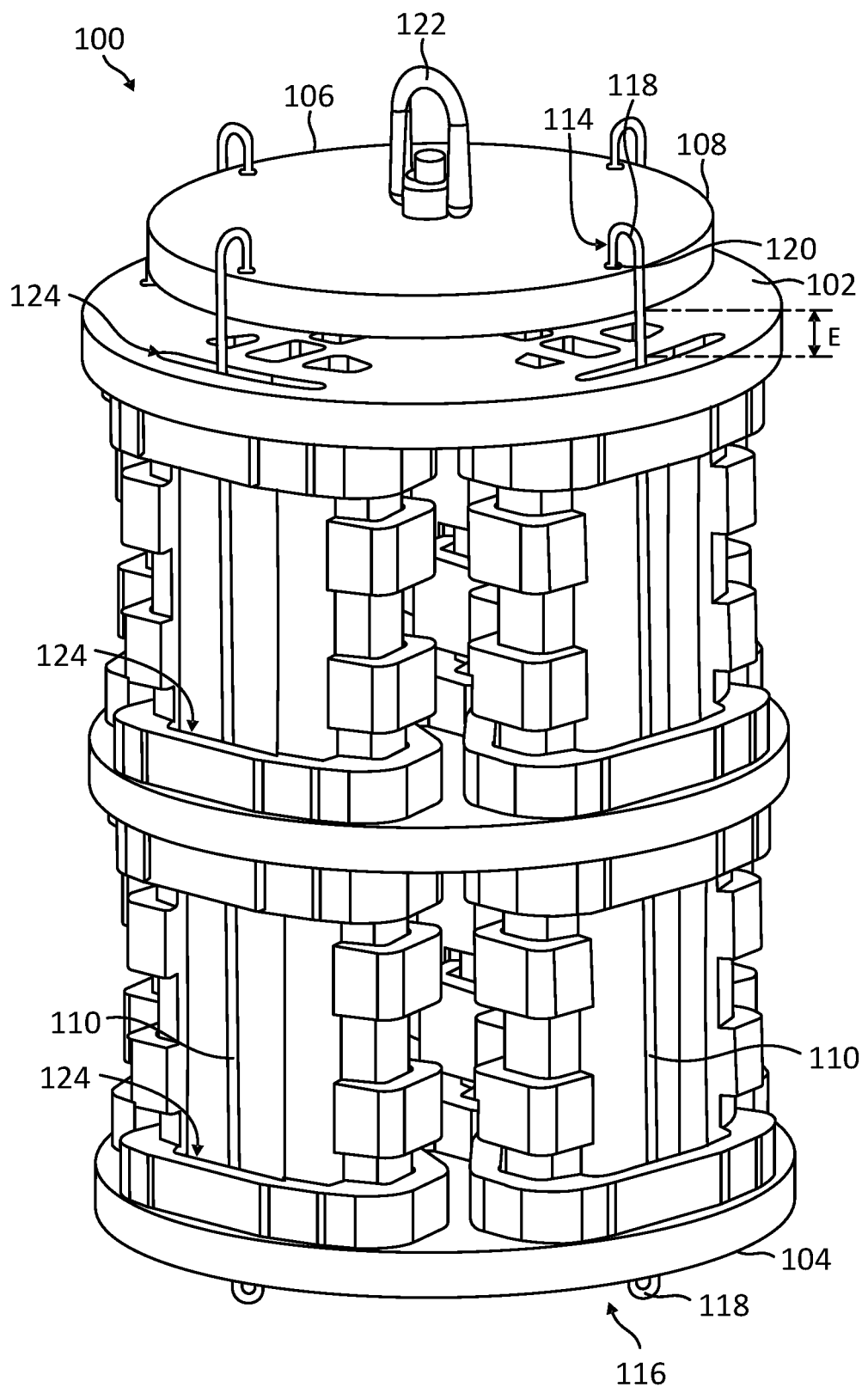
FIG. 9 is a schematic perspective view illustrating an example load assembly for a CVI/CVD furnace including an installation jig.

The disclosure also describes an installation jig for loading a load assembly (e.g., load assembly 60) in a furnace (e.g., furnace 10). FIG. 9 is a perspective diagram illustrating an example load assembly 100 and installation jig 106. Load assembly 100 may be an example of load assembly 60 illustrated in FIGS. 6 and 7, and the furnace may be a CVI/CVD furnace such as furnace 10 illustrated in FIG. 1.

Load assembly 100 includes a top 102 and a bottom 104. Assembly 100 is configured to be used with an installation jig 106. Top 102 and bottom 104 may be diffuser plates, such as diffuser plates 62, 64, or 74 shown in FIG. 6. Installation jig 106 includes a lifting plate 108 and a plurality of rods 110. Each rod of plurality of rods 110 may include first end 114 and second end 116. At least one rod of plurality of rods 110 may have at least one turn 118 near each of first end 114 and second end 116. Turn 118 near each end of at least one rod 112 may be on a portion of rod 112 that extends beyond top 102 and bottom 104 of load assembly 100. Plurality of rods 110 may extend through apertures 124 in load assembly 100 and engage with lifting plate 108 when load assembly 100 is lifted, such that load assembly 100 can be lifted from the top by lifting plate 108.

In some examples, turns 118 near each end of at least one rod 112 are substantially 180 degree bends. A turn 118 which is a 180 degree bend may allow the first end 114 of rod 110 to fit in a depression 120 of a lifting plate 106. In some examples, each rod in the plurality of rods 110 includes a substantially 180 degree turn that allows the end to engage in a corresponding depression 120 in the lifting plate 106. Fitting at least the first end 114 of one rod 110 into a depression 120 in lifting plate 108 may provide for stability during lifting and moving of assembly 100.

In some examples, each rod of plurality of rods 110 may be disposed within a corresponding aperture of plurality of apertures 124 in load assembly 100. In some examples, plurality of apertures 124 may include slots. A slot may be an aperture with a shape that allows a rod of the plurality of rods 110 to pass through it.

In some examples, each rod of plurality of rods 110 has an extra length E. Extra length E may be disposed between the turns 118 near each end (114, 116) of each rod 112. Extra length, E, may allow each rod 112 of plurality of rods 110 to extend beyond top 102 and bottom 104 of load assembly 100, so installation jig 106 can be removed from load assembly 100 by turning each rod 112 so that the turns 118 near each end of each rod does not engage lifting plate 106 or bottom 104 when rod 112 slides out of the plurality of apertures 124 in load assembly 100.

In some examples, lifting plate 108 may include lifting eye 122. Lifting eye 122 may function to allow assembly 100 to be lifted from the top by one point of contact at lifting eye 122. Lifting eye 122 may be a hook, hoist ring, eyebolt, quick connect fitting, or the like.

Installation jig 106 thus may enable simple engagement, lifting, and disengagement of installation jig 106 with load assembly 100. For instance, to engage installation jig 106, lifting plate 108 may be set on top 102 of load assembly 100. Rods 110 may be inserted through apertures 124 of each level (e.g., diffuser plate and fixture) of load assembly 100.

Rods 110 then may be rotated so that ends 114 and 116 extend over lifting plate 108 and extend under bottom 104. By lifting lifting plate 108 via lifting eye 122, lifting plate 108 may engage ends 114 of rods 110, transferring lifting force via rods 110 to bottom 104. Once load assembly 100 is moved to a desired location, lifting eye 122 may be lowered, which lowers lifting plate 108 and disengages lifting plate 108 from first ends 114 of rods 110, due to extra length E. Rods 110 then may be rotated so that ends 114, 116 are aligned and can slide through apertures 124 to remove rods 110 from load assembly 100.

Figure 10:
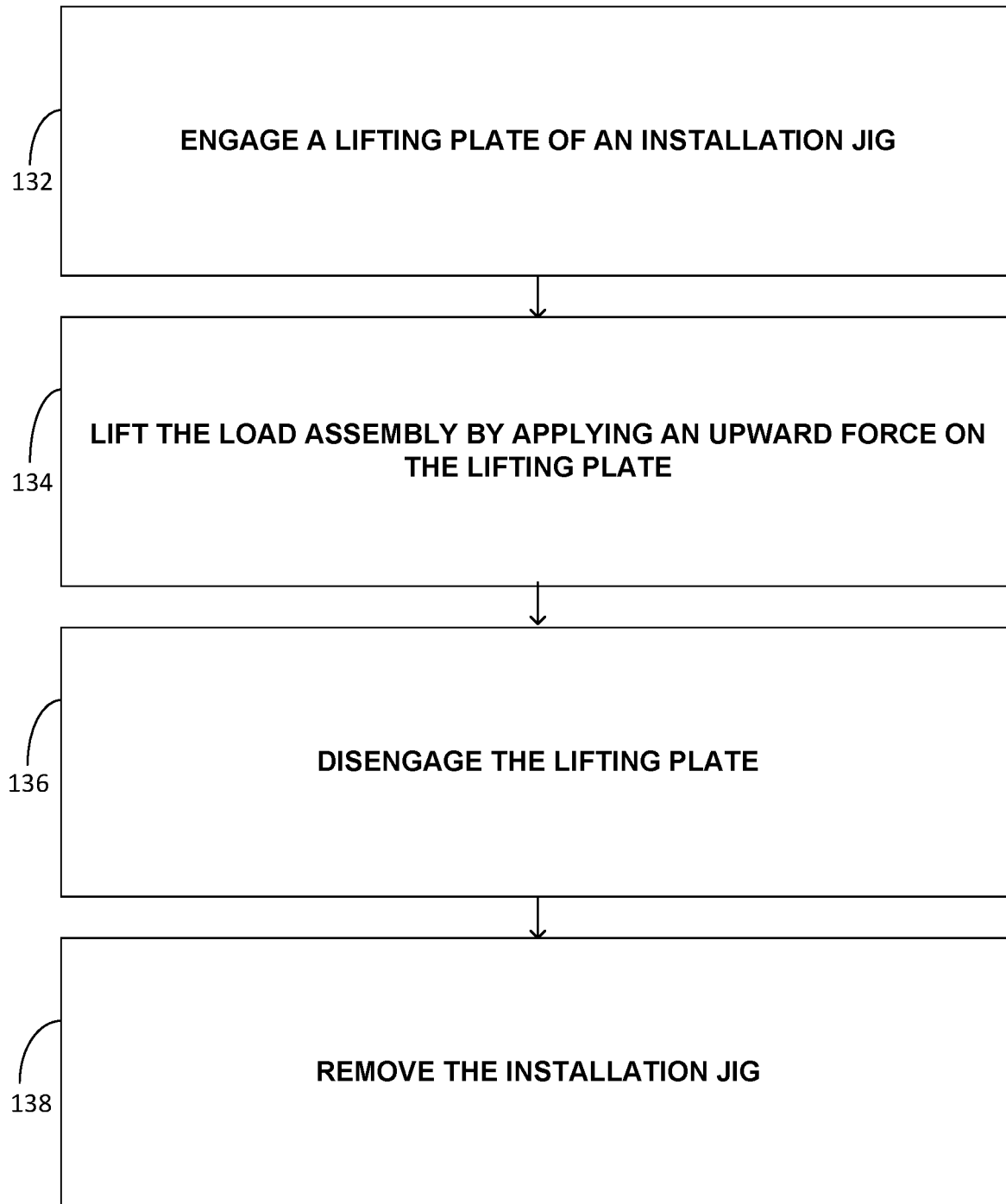
FIG. 10 is a flowchart illustrating an example technique for loading or unloading a furnace using an installation jig.

FIG. 10 is a flowchart illustrating a technique for loading or unloading a load assembly into a furnace. The illustrated technique may be used to load or unload a load assembly such as load assembly 100 illustrated in FIG. 9 into or out of a furnace, such as furnace 10 of FIG. 1. The technique of FIG. 10 will be described with concurrent reference to FIG. 9. A person having skill in the art will understand that the technique of FIG. 10 may be performed using a different load assembly and installation jig, and that load assembly 100 and installation jig 106 may be used to perform different techniques.

The technique of FIG. 10 includes engaging lifting plate 108 of installation jig 106 (132). Lifting plate 108 may be located on top of load assembly 100. Load assembly may include a main body top, such as top 102, and a bottom, such as bottom 104, as illustrated in FIG. 9. The load assembly main body may be configured to be disposed within a furnace working zone, such as furnace working zone 12 as illustrated in FIG. 1. Engaging lifting plate 108 may enable lifting of the load assembly 10 via plurality of rods 110.

The technique of FIG. 10 also includes lifting load assembly 100 by applying an upward force on lifting plate 108 (134). Load assembly 100 may be lifted by applying upward force on lifting plate 108. As illustrated in FIG. 9, applying upward force on lifting plate 108 may apply upward force on plurality of rods 110, which may apply upward force on bottom 304 of load assembly 100, which may result in lifting the entire assembly.

The technique of FIG. 10 further includes disengaging lifting plate 108 (136). Disengaging lifting plate 108 may include resting load assembly 100 on a surface. In other words, lifting plate 108 may be disengaged by setting down the assembly 100, relieving tension on lifting plate 108 and the plurality of rods 110.

The technique of FIG. 10 includes removing installation jig 106 from load assembly 100 (138). In some examples, removing installation jig 106 includes twisting at least one rod of the plurality of rods 110, where the turns 118 near each end 114, 116 of at least one rod are substantially 180 degree bends. In some examples, removing installation jig 106 includes removing the plurality of rods 110 from their location within a plurality of apertures 124 in load assembly 110.

Various examples have been described. These and other examples are within the scope of the following clauses and claims.

Clause 1A. A preheater comprising: a central inlet; a circuitous gas flow path downstream of the central inlet; a plenum section downstream of the circuitous gas flow path; and an outlet diffuser plate defining a plurality of apertures fluidly configured to couple the preheater to a furnace working zone, wherein the outlet diffuser plate is downstream of the plenum section, wherein the circuitous gas flow path is fluidly coupled to the plenum section by an outer circumferential slot opening.

Clause 2A. The preheater of clause 1A, wherein the outer circumferential slot opening is substantially circumferentially symmetrical about the central inlet.

Clause 3A. The preheater of clause 1A, wherein the outlet diffuser plate defines a plurality of apertures located to direct gas flow into portions of the working zone configured to support parts for heat treatment.

Clause 4A. The preheater of clause 1A, wherein a plurality of baffles define the circuitous flow path.

Clause 5A. The preheater of clause 1A, wherein the circuitous gas flow path is defined by two opposing members, wherein each member has a plurality of concentric circle protrusions, and wherein the plurality of concentric circle protrusions from each opposing member are configured to interleave, with each concentric circle protrusion defining a baffle, such that the plurality of concentric circle protrusions from each opposing member define a plurality of baffles, and the plurality of baffles define the circuitous path gas flow section.

Clause 6A. The preheater of clause 1A, wherein the preheater comprises graphite.

Clause 7A. The preheater of clause 1A, wherein the plenum section is configured to produce a substantially uniform static pressure across the plurality of apertures in the outlet diffuser plate when the preheater is in operation, such that the mass flow rate of reactant gases out of the plurality of apertures into the furnace working zone is substantially uniform.

Clause 8A. A chemical vapor infiltration/chemical vapor deposition (CVI/CVD) furnace comprising: a preheater comprising: a central inlet; a circuitous gas flow path downstream of the central inlet; a plenum section downstream of the circuitous gas flow path; and an outlet diffuser plate defining a plurality of apertures fluidly configured to couple the preheater to a furnace working zone, wherein the outlet diffuser plate is downstream of the plenum section, wherein the circuitous gas flow path is fluidly coupled to the plenum section by an outer circumferential slot opening.

Clause 9A. The CVI/CVD furnace of clause 8A, wherein the outer circumferential slot opening is substantially circumferentially symmetrical about the central inlet.

Clause 10A. The CVI/CVD furnace of clause 8A, wherein the outlet diffuser plate defines a plurality of apertures located to direct gas flow into portions of the working zone configured to support parts for heat treatment.

Clause 11A. The CVI/CVD furnace of clause 8A, wherein a plurality of baffles define the circuitous flow path.

Clause 12A. The CVI/CVD furnace of clause 8A, wherein the circuitous gas flow path is defined by two opposing members, wherein each member has a plurality of concentric circle protrusions, and wherein the plurality of concentric circle protrusions from each opposing member are configured to interleave, with each concentric circle protrusion defining a baffle, such that the plurality of concentric circle protrusions from each opposing member define a plurality of baffles, and the plurality of baffles define the circuitous path gas flow section.

Clause 13A. The CVI/CVD furnace of clause 8A, wherein the preheater comprises graphite.

Clause 14A. The CVI/CVD furnace of clause 8A, wherein the plenum section has a substantially uniform static pressure across the plurality of apertures in the outlet diffuser plate when the preheater is in operation, such that the mass flow rate of reactant gases out of the plurality of apertures into the furnace working zone is substantially uniform.

Clause 15A. A method of preheating reactant gases for a chemical vapor infiltration/chemical vapor deposition (CVI/CVD) furnace comprising: receiving reactant gases in a preheater through a central inlet of the preheater; heating the received reactant gases while the gases flow through a circuitous gas flow path of the preheater, wherein the preheater includes a plenum section downstream of the circuitous gas flow path, and wherein the circuitous gas flow path is fluidly coupled to the plenum section by an outer circumferential slot opening; and outputting the heated reactant gases into a working zone of the furnace through an outlet diffuser plate defining a plurality of apertures fluidly coupling the preheater to the working zone, wherein the outlet diffuser plate is downstream of the plenum section.

Clause 16A. The method of clause 15A, wherein heating the received reactant gases includes heating the received reactant gases to a temperature substantially the same as a temperature of the working zone of the furnace.

Clause 17A. The method of clause 15A, wherein the outer circumferential slot opening is substantially circumferentially symmetrical about the central inlet.

Clause 18A. The method of clause 15A, wherein the outlet diffuser plate defines a plurality of apertures located to direct gas flow into portions of the working zone configured to support parts for heat treatment.

Clause 19A. The method of clause 15A, wherein a plurality of baffles define the circuitous flow path.

Clause 20A. The method of clause 15A, wherein the circuitous gas flow path is defined by two opposing members, wherein each member has a plurality of concentric circle protrusions, and wherein the plurality of concentric circle protrusions from each opposing member are configured to interleave, with each concentric circle protrusion defining a baffle, such that the plurality of concentric circle protrusions from each opposing member define a plurality of baffles, and the plurality of baffles define the circuitous path gas flow section.

Clause 1B. A directed flow chemical vapor infiltration/chemical vapor deposition (CVI/CVD) furnace comprising: a furnace body containing a furnace working zone; a load assembly disposed within the furnace working zone, the load assembly comprising: a first diffuser plate; a second diffuser plate oriented substantially parallel to and spaced apart from the first diffuser plate, wherein the first and second diffuser plates are positioned with respect to each other such that there is a space between the first and second diffuser plates; a fixture configured to be positioned in the space and supported between the first and second diffuser plates, wherein the fixture is configured to contain a part to be treated by gases flowing through the load assembly; a plurality of channel forming features configured to be positioned relative to the fixture to guide the flow of gases into a plurality of ducts defined by the plurality of channel forming features and the fixture, wherein the plurality of ducts are configured to at least partially contain gas flowing through the plurality of ducts and direct at least some of the gas to the parts contained by the fixture; wherein each diffuser plate defines a plurality of apertures located at desired areas of the diffuser plate relative to the plurality of ducts such that apertures of the plurality of apertures and ducts of the plurality of ducts are in fluid communication.

Clause 2B. The directed flow CVI/CVD furnace of clause 1B, wherein the fixture defines perforations configured to allow gas to exit the plurality of ducts.

Clause 3B. The directed flow CVI/CVD furnace of clause 1B, wherein at least one of the furnace body, the first diffuser plate, the second diffuser plate, the fixture, or the plurality of channel forming features comprise graphite.

Clause 4B. The directed flow CVI/CVD furnace of clause 1B, wherein the first diffuser plate and the second diffuser plate are substantially similar, such that the plurality of apertures defined by the first diffuser plate and the second diffuser plate are located at substantially similar positions of the first and second diffuser plates.

Clause 5B. The directed flow CVI/CVD furnace of clause 1B, wherein each diffuser plate of the first and second diffuser plates has portions which define a plurality of apertures and other portions which are solid.

Clause 6B. The directed flow CVI/CVD furnace of clause 1B, wherein the fixture comprises a plurality of fixtures, and wherein each diffuser plate of the first and second diffuser plates defines a number of portions corresponding to the number of fixtures, and wherein each portion of the number of portions comprises a plurality of apertures.

Clause 7B. A load assembly comprising: a first diffuser plate; a second diffuser plate oriented substantially parallel to and spaced apart from the first diffuser plate, wherein the first and second diffuser plates are positioned with respect to each other such that there is a space between the first and second diffuser plates; a fixture configured to be positioned in the space and supported between the first and second diffuser plates, wherein the fixture is configured to contain a part to be treated by gases flowing through the load assembly; a plurality of channel forming features configured to be positioned relative to the fixture to guide the flow of gases into a plurality of ducts defined by the plurality of channel forming features and the fixture, wherein the plurality of ducts are configured to at least partially contain gas flowing through the plurality of ducts and direct at least some of the gas to the parts contained by the fixture; wherein each diffuser plate defines a plurality of apertures located at desired areas of the diffuser plate relative to the plurality of ducts such that apertures of the plurality of apertures and ducts of the plurality of ducts are in fluid communication.

Clause 8B. The load assembly of clause 7B, wherein the fixture defines perforations configured to allow gas to exit the plurality of ducts.

Clause 9B. The load assembly of clause 7B, wherein at least one of the first diffuser plate, the second diffuser plate, the fixture, or the plurality of channel forming features comprise graphite.

Clause 10B. The load assembly of clause 7B, wherein the first diffuser plate and the second diffuser plate are substantially similar, such that the plurality of apertures defined by the first diffuser plate and the second diffuser plate are located at substantially similar positions of the first and second diffuser plates.

Clause 11B. The load assembly of clause 7B, wherein each diffuser plate of the first and second diffuser plates has portions which define a plurality of apertures and other portions which are solid.

Clause 12B. The load assembly of clause 7B, wherein the fixture comprises a plurality of fixtures, and wherein each diffuser plate of the first and second diffuser plates defines a number of portions corresponding to the number of fixtures, and wherein each portion of the number of portions comprises a plurality of apertures.

Clause 13B. A method of CVI/CVD processing comprising: receiving reactant gases in a load assembly, wherein the load assembly is disposed within a furnace working zone; directing the flow of the reactant gases through the load assembly, wherein the load assembly comprises a first diffuser plate, a second diffuser plate oriented substantially parallel to and spaced apart from the first diffuser plate, wherein the first and second diffuser plates are positioned with respect to each other such that there is a space between the first and second diffuser plates; wherein directing the flow of reactant gases includes guiding reactant gases substantially between the first diffuser plate and the second diffuser plate through a plurality of ducts; wherein the plurality of ducts are defined by a plurality of channel forming features and a fixture, wherein the plurality of ducts are configured to at least partially contain reactant gases flowing through the plurality of ducts and direct at least some of the gas to the parts contained by the fixture; wherein the fixture is configured to be positioned in the space and supported between the first and second diffuser plates, wherein the fixture is configured to contain a part to be treated by gases flowing through the load assembly, wherein the plurality of channel forming features are configured to be positioned relative to the fixture to guide the flow of gases into a plurality of ducts defined by the plurality of channel forming features and the fixture; wherein each diffuser plate defines a plurality of apertures located at desired areas of the diffuser plate relative to the plurality of ducts such that apertures of the plurality of apertures and ducts of the plurality of ducts are in fluid communication; and exhausting the reactant gases from the load assembly.

Clause 14B. The method of clause 13B, wherein the fixture defines perforations configured to allow gas to exit the plurality of ducts.

Clause 15B. The method of clause 13B, wherein at least one of the first diffuser plate, the second diffuser plate, the fixture, or the plurality of channel forming features comprise graphite.

Clause 16B. The method of clause 13B, wherein the first diffuser plate and the second diffuser plate are substantially similar, such that the plurality of apertures defined by the first diffuser plate and the second diffuser plate are located at substantially similar positions of the first and second diffuser plates.

Clause 17B. The method of clause 13B, wherein each diffuser plate of the first and second diffuser plates has portions which define a plurality of apertures and other portions which are solid.

Clause 18B. The method of clause 13B, wherein the fixture comprises a plurality of fixtures, and wherein each diffuser plate of the first and second diffuser plates defines a number of portions corresponding to the number of fixtures, and wherein each portion of the number of portions comprises a plurality of apertures.

Clause 19B. The method of clause 13B, wherein a velocity of gases flowing through the plurality of ducts is at least about 20 meters per second.

Clause 1C. An assembly comprising: a load assembly configured to be disposed within a furnace working zone, the load assembly comprising a top and a bottom; an installation jig comprising: a lifting plate; a plurality of rods, each rod having a first end and a second end, wherein at least one rod of the plurality of rods has at least one turn near each end; wherein the turn near each end of at least one rod is on a portion of the rod that extends beyond the top and bottom of the load assembly; and wherein the plurality of rods are disposed within apertures in the load assembly and engage with the lifting plate when the load assembly is lifted, such that the load assembly can be lifted from the top by lifting the lifting plate.

Clause 2C. The assembly of clause 1C, wherein the turns near each end of at least one rod are substantially 180 degree bends.

Clause 3C. The assembly of clause 2C, wherein each rod of the plurality of rods is disposed within a corresponding aperture of a plurality of apertures in the load assembly, wherein the plurality of apertures in the load assembly are slots, wherein each slot allows a rod of the plurality of rods to pass through it.

Clause 4C. The assembly of clause 3C, further comprising: wherein each rod of the plurality of rods has a turn near each end; wherein each rod of the plurality of rods has an extra length, wherein the extra length is disposed between the turn near each end; wherein the extra length allows each rod to extend beyond the top and bottom of the load assembly, so the installation jig can be removed from the load assembly by turning each rod so that the turn near each end of each rod does not engage the lifting plate or the bottom of the load assembly when the rod slides out of the plurality of apertures in the load assembly.

Clause 5C. The assembly of clause 1C, wherein the lifting plate further comprising a lifting eye.

Clause 6C. The assembly of clause 1C, further comprising at least one depression in the lifting plate configured to contain at least one end of one rod of the plurality of rods.

Clause 7C. An installation jig, comprising: a lifting plate; and a plurality of rods, each rod having a first end and a second end, wherein at least one rod of the plurality of rods has at least one turn near each end; wherein the turn near each end of at least one rod is configured to be disposed on a portion of the at least one rod that extends beyond the top and the bottom of a load assembly; and wherein the plurality of rods are configured to be disposed within apertures in the load assembly and engage with the lifting plate when the load assembly is lifted, such that the load assembly can be lifted from the top by lifting the lifting plate.

Clause 8C. The installation jig of clause 7C, wherein the turns near each end of at least one rod are substantially 180 degree bends.

Clause 9C. The installation jig of clause 8C, wherein each rod of the plurality of rods is configured to be disposed within a corresponding aperture of a plurality of apertures in the load assembly, wherein the plurality of apertures in the load assembly are slots, wherein each slot allows a rod of the plurality of rods to pass through it.

Clause 10C. The installation jig of clause 9C, further comprising: wherein each rod of the plurality of rods has a turn near each end; wherein each rod of the plurality of rods has an extra length, wherein the extra length is disposed between the turn near each end; wherein the extra length allows each rod to extend beyond the top and bottom of the load assembly, so the installation jig can be removed from the load assembly by turning each rod so that the turn near each end of each rod does not engage the lifting plate or the bottom of the load assembly when the rod slides out of the plurality of apertures in the load assembly.

Clause 11C. The installation jig of clause 7C, wherein the lifting plate further comprising a lifting eye.

Clause 12C. The installation jig of clause 7C, further comprising at least one depression in the lifting plate configured to contain at least one end of one rod of the plurality of rods.

Clause 13C. A method of loading or unloading a furnace, the method comprising: engaging a lifting plate of an installation jig, wherein the lifting plate is located on top of a load assembly having a main body, wherein the main body has a top and a bottom, wherein the load assembly main body is configured to be disposed within a furnace working zone, wherein engaging the lifting plate enables lifting the load assembly through a plurality of rods, each rod having a first end and a second end, wherein at least one rod of the plurality of rods has at least one turn near each end, wherein the turn near each end of at least one rod is on a portion of the rod that extends beyond the top and bottom of the load assembly; lifting the load assembly by applying upward force on the lifting plate; disengaging the lifting plate; and removing the installation jig.

Clause 14C. The method of clause 13C, wherein removing the installation jig includes twisting at least one rod of the plurality of rods, and the turns near each end of at least one rod are substantially 180 degree bends.

Clause 15C. The method of clause 13C, wherein removing the installation jig includes removing the plurality of rods; wherein the plurality of rods are disposed within a plurality of apertures in the load assembly, wherein the plurality of apertures in the load assembly are slots, wherein each slot allows a rod from the plurality of rods to pass through it.

Clause 16C. The method of clause 13C, further comprising: wherein each rod of the plurality of rods each have a turn near each end; wherein each rod of the plurality of rods has an extra length, wherein the extra length is disposed between the turn near each end; wherein the extra length allows each rod to extend beyond the top and bottom of the load assembly, so the installation jig can be removed from the load assembly by turning each rod so that the turn near each end of each rod does not engage the lifting plate or the bottom of the load assembly when the rod slides out of the plurality of apertures in the load assembly.

Clause 17C. The method of clause 13C, further comprising engaging a lifting eye as the means of engaging the lifting plate.

Clause 18C. The method of clause 13C, wherein removing the installation jig includes displacing at least one end of one rod from the plurality of rods from at least one depression in the lifting plate.

What is claimed is:

1. A directed flow chemical vapor infiltration/chemical vapor deposition (CVI/CVD) furnace comprising:
    a furnace body containing a furnace working zone;
    a load assembly disposed within the furnace working zone, the load assembly comprising:
        a first diffuser plate;
        a second diffuser plate oriented substantially parallel to and spaced apart from the first diffuser plate, wherein the first and second diffuser plates are positioned with respect to each other such that there is a space between the first and second diffuser plates;
        a plurality of fixtures, a first fixture of the plurality of fixtures configured to be positioned in the space and supported between the first and second diffuser plates, wherein the first fixture is configured to contain a part to be treated by gases flowing through the load assembly;
        a plurality of channel forming features configured to be positioned relative to the first fixture to guide the flow of gases into a plurality of ducts defined by the plurality of channel forming features and the first fixture, wherein the plurality of ducts are configured to at least partially contain gas flowing through the plurality of ducts and direct at least some of the gas to the part contained by the first fixture;
        wherein each diffuser plate defines a plurality of apertures located at desired areas of the diffuser plate relative to the plurality of ducts such that apertures of the plurality of apertures and ducts of the plurality of ducts are in fluid communication, and
        wherein more than one aperture of the plurality of apertures are configured to guide gases flowing through the first diffuser plate into the first fixture to route gases to the part contained by the first fixture such that the gases interact with the part.

2. The directed flow CVI/CVD furnace of claim 1, wherein the first fixture defines perforations configured to allow gas to exit the plurality of ducts.

3. The directed flow CVI/CVD furnace of claim 1, wherein at least one of the furnace body, the first diffuser plate, the second diffuser plate, the first fixture, or the plurality of channel forming features comprise graphite.

4. The directed flow CVI/CVD furnace of claim 1, wherein the first diffuser plate and the second diffuser plate are substantially similar, such that the plurality of apertures defined by the first diffuser plate and the second diffuser plate are located at substantially similar positions of the first and second diffuser plates.

5. The directed flow CVI/CVD furnace of claim 1, wherein each diffuser plate of the first and second diffuser plates has portions which define the plurality of apertures and other portions which are solid.

6. The directed flow CVI/CVD furnace of claim 1, wherein each diffuser plate of the first and second diffuser plates defines a number of portions corresponding to the number of fixtures in the plurality of fixtures, and wherein each portion of the number of portions comprises a plurality of apertures.

7. A load assembly comprising:
    a first diffuser plate;
    a second diffuser plate oriented substantially parallel to and spaced apart from the first diffuser plate, wherein the first and second diffuser plates are positioned with respect to each other such that there is a space between the first and second diffuser plates;
    a plurality of fixtures, a first fixture of the plurality of fixtures configured to be positioned in the space and supported between the first and second diffuser plates, wherein the first fixture is configured to contain a part to be treated by gases flowing through the load assembly;
    a plurality of channel forming features configured to be positioned relative to the first fixture to guide the flow of gases into a plurality of ducts defined by the plurality of channel forming features and the first fixture, wherein the plurality of ducts are configured to at least partially contain gas flowing through the plurality of ducts and direct at least some of the gas to the part contained by the first fixture;
    wherein each diffuser plate defines a plurality of apertures located at desired areas of the diffuser plate relative to the plurality of ducts such that apertures of the plurality of apertures and ducts of the plurality of ducts are in fluid communication; and
    wherein more than one aperture of the plurality of apertures are configured to guide gases flowing through the first diffuser plate into the first fixture to route gases to the part contained by the first fixture such that the gases interact with the part.

8. The load assembly of claim 7, wherein the first fixture defines perforations configured to allow gas to exit the plurality of ducts.

9. The load assembly of claim 7, wherein at least one of the first diffuser plate, the second diffuser plate, the first fixture, or the plurality of channel forming features comprise graphite.

10. The load assembly of claim 7, wherein the first diffuser plate and the second diffuser plate are substantially similar, such that the plurality of apertures defined by the first diffuser plate and the second diffuser plate are located at substantially similar positions of the first and second diffuser plates.

11. The load assembly of claim 7, wherein each diffuser plate of the first and second diffuser plates has portions which define the plurality of apertures and other portions which are solid.

12. The load assembly of claim 7, wherein each diffuser plate of the first and second diffuser plates defines a number of portions corresponding to the number of fixtures in the plurality of fixtures, and wherein each portion of the number of portions comprises a plurality of apertures.

13. A method of CVI/CVD processing comprising:
receiving reactant gases in a load assembly, wherein the load assembly is disposed within a furnace working zone;
directing the flow of the reactant gases through the load assembly, wherein the load assembly comprises a first diffuser plate, a second diffuser plate oriented substantially parallel to and spaced apart from the first diffuser plate, wherein the first and second diffuser plates are positioned with respect to each other such that there is a space between the first and second diffuser plates;
wherein directing the flow of reactant gases includes guiding reactant gases substantially between the first diffuser plate and the second diffuser plate through a plurality of ducts;
wherein the plurality of ducts are defined by a plurality of channel forming features and a first fixture of a plurality of fixtures, wherein the plurality of ducts are configured to at least partially contain reactant gases flowing through the plurality of ducts and direct at least some of the gas to a part contained by the first fixture;
wherein the first fixture is configured to be positioned in the space and supported between the first and second diffuser plates, wherein the first fixture is configured to contain the part to be treated by gases flowing through the load assembly,
wherein the plurality of channel forming features are configured to be positioned relative to the first fixture to guide the flow of gases into a plurality of ducts defined by the plurality of channel forming features and the first fixture;
wherein each diffuser plate defines a plurality of apertures located at desired areas of the diffuser plate relative to the plurality of ducts such that apertures of the plurality of apertures and ducts of the plurality of ducts are in fluid communication,
wherein more than one aperture of the plurality of apertures are configured to guide gases flowing through the first diffuser plate into the first fixture to route gases to the part contained by the first fixture such that the gases interact with the part; and
exhausting the reactant gases from the load assembly.

14. The method of claim 13, wherein the first fixture defines perforations configured to allow gas to exit the plurality of ducts.

15. The method of claim 13, wherein at least one of the first diffuser plate, the second diffuser plate, the first fixture, or the plurality of channel forming features comprise graphite.

16. The method of claim 13, wherein the first diffuser plate and the second diffuser plate are substantially similar, such that the plurality of apertures defined by the first diffuser plate and the second diffuser plate are located at substantially similar positions of the first and second diffuser plates.

17. The method of claim 13, wherein each diffuser plate of the first and second diffuser plates has portions which define the plurality of apertures and other portions which are solid.

18. The method of claim 13, wherein each diffuser plate of the first and second diffuser plates defines a number of portions corresponding to the number of fixtures in the plurality of fixtures, and wherein each portion of the number of portions comprises a plurality of apertures.

19. The method of claim 13, wherein a velocity of gases flowing through the plurality of ducts is at least about 20 meters per second.

* * * * *